US008902205B2

(12) United States Patent
Miyazawa et al.

(10) Patent No.: US 8,902,205 B2
(45) Date of Patent: Dec. 2, 2014

(54) LATCHING CIRCUITS FOR MEMS DISPLAY DEVICES

(75) Inventors: Toshio Miyazawa, Chiba (JP); Mitsuhide Miyamoto, Kawasaki (JP)

(73) Assignee: Pixtronix, Inc., San Diego, CA (US)

( * ) Notice: Subject to any disclaimer, the term of this patent is extended or adjusted under 35 U.S.C. 154(b) by 360 days.

(21) Appl. No.: 13/483,975

(22) Filed: May 30, 2012

(65) Prior Publication Data

US 2012/0306842 A1 Dec. 6, 2012

Related U.S. Application Data

(60) Provisional application No. 61/492,201, filed on Jun. 1, 2011.

(51) Int. Cl.

*G06F 3/038* (2013.01)
*H03K 3/00* (2006.01)
*G09G 3/34* (2006.01)

(52) U.S. Cl.

CPC ...... *G09G 3/3466* (2013.01); *G09G 2300/0857* (2013.01)
USPC .............................. 345/204; 345/214; 345/83

(58) Field of Classification Search

CPC ............................... G09G 3/3466; G09G 5/00
USPC ............................. 345/83–84, 204, 214, 109; 315/169.1–169.4
See application file for complete search history.

(56) References Cited

U.S. PATENT DOCUMENTS

| | | | | |
|---|---|---|---|---|
| 5,798,746 | A | 8/1998 | Koyama | |
| 7,839,356 | B2 * | 11/2010 | Hagood et al. | 345/55 |
| 2002/0130828 | A1 | 9/2002 | Yamazaki et al. | |
| 2008/0174532 | A1 * | 7/2008 | Lewis | 345/85 |
| 2010/0134390 | A1 * | 6/2010 | Shin et al. | 345/84 |
| 2010/0245304 | A1 * | 9/2010 | Umezaki | 345/205 |

OTHER PUBLICATIONS

International Search Report and Written Opinion—PCT/US2012/040236—ISA/EPO—Sep. 27, 2012.

* cited by examiner

*Primary Examiner* — Andrew Sasinowski
(74) *Attorney, Agent, or Firm* — Edward A. Gordon; Foley & Lardner LLP

(57) ABSTRACT

The described latching circuits can be formed using transistors of a single conductivity type. The transistors can be n-type transistors or p-type transistors. The latching circuits include at least one pre-charge transistor and at least one output terminal discharge transistor. Timing schemes are also described for operating the latching circuits. Pixel circuits and display devices that include these latching circuits are also described. The display devices are formed from an arrangement of the latching circuits.

20 Claims, 19 Drawing Sheets

LATCHING CIRCUITS FOR MEMS DISPLAY DEVICES

CROSS-REFERENCE TO RELATED APPLICATIONS

This Patent Application claims priority to U.S. Provisional Patent Application No. 61/492,201, filed on Jun. 1, 2011, entitled "Latching Circuits for MEMS Display Devices." The disclosure of the prior Application is considered part of and is incorporated by reference in this Patent Application.

TECHNICAL FIELD

The disclosure relates to the field of latching circuits. In particular, this disclosure relates to pixel circuits and display devices that include the latching circuits.

DESCRIPTION OF THE RELATED TECHNOLOGY

Display devices use two-dimensional arrangements of light modulating elements to display images and video content. Selective modulation of light at each pixels of the two-dimensional array produces the images of each frame of content.

Some display devices actuate light modulators (such as shutters) by mechanical means in order to display the image or video content. A display device that actuates a shutter by electrical means can facilitate faster shutter movement, and thus provide for faster pixel refresh rates during display.

SUMMARY

The systems, methods and devices of the disclosure each have several innovative aspects, no single one of which is solely responsible for the desirable attributes disclosed herein.

One innovative aspect of the subject matter described in this disclosure can be implemented in an apparatus having a plurality of MEMS devices arranged in an array and a control matrix comprising only n-type or only p-type transistors coupled to the plurality of MEMS devices to communicate data and drive voltages to the MEMS devices. For each MEMS device, the control matrix includes a latch configured to maintain a difference in voltage levels on a first output terminal and a second output terminal. The latch includes a first pre-charge transistor and a first output terminal discharge transistor coupled to the first output terminal, a second pre-charge transistor and a second output terminal discharge transistor coupled to the second output terminal and a pixel discharge transistor coupled to the first output terminal discharge transistor and the second output terminal discharge transistor. The latch is configured such that a state of the first output terminal discharge transistor is controlled based on a voltage level of the second output terminal applied to a gate of the first output terminal discharge transistor. In some implementations, the first pre-charge transistor can be a diode-connected transistor. In some implementations, the apparatus is a display apparatus and the MEMS device includes a shutter that is actuated based on the voltage levels on the first output terminal and the second output terminal. In some implementations, the apparatus also includes a first latching control line that is coupled to the first output terminal by the first pre-charge transistor and configured to apply a first driver voltage and to pre-charge the first output terminal from a first voltage level to a second voltage level that is different from the first voltage level based on application of the first driver voltage. The apparatus can be configured to discontinue the first driver voltage such that the first output terminal returns to the first voltage level or maintains the first output terminal at the second voltage level based on a voltage retained in a retention capacitor.

In some implementations, an end of the retention capacitor is connected to the first latching control line and the first driver clock voltage acts as a bias voltage of the retention capacitor. In some implementations, a second latching control line is coupled to the second output terminal by the second pre-charge transistor and configured to apply a second driver voltage and pre-charge the second output terminal from the first voltage level to the second voltage level based on application of the second driver voltage. In some such implementations, the apparatus is configured to discontinue the second driver voltage at a later time than the first driver voltage is discontinued such that the voltage is retained in the retention capacitor. In some implementations, the apparatus is configured to initiate the first driver voltage and the second driver clock voltage at a same time. In some implementations, the pixel discharge transistor controls a discharge of the first output terminal and the second output terminal through the first output terminal discharge transistor and the second output terminal discharge transistor. In some implementations, each of the first pre-charge transistor, the first output terminal discharge transistor, the second pre-charge transistor and the second output terminal discharge transistor is configured as two transistors coupled with a common gate.

Another innovative aspect of the subject matter described in this disclosure can be implemented in an apparatus having a plurality of MEMS devices arranged in an array and a control matrix that includes only n-type or only p-type transistors coupled to the plurality of MEMS devices to communicate data and drive voltages to the MEMS devices. For each MEMS device, the control matrix includes a latch that is configured to maintain a difference in voltage levels on a first output terminal and a second output terminal and includes a first pre-charge transistor and a first output terminal discharge transistor coupled to the first output terminal and a second output terminal discharge transistor coupled to the first output terminal discharge transistor. The latch is further configured such that the output of the second output terminal discharge transistor selectively controls the first output terminal discharge transistor to selectively discharge voltage stored on the first output terminal, thereby controlling a voltage level of the first output terminal. In some implementations, the first pre-charge transistor can be a diode-connected transistor.

In some implementations, the apparatus is a display apparatus and the MEMS device includes a shutter that is actuated based on the voltage levels on the first output terminal and the second output terminal. In some implementations, the apparatus further includes a first latching control line coupled to the first output terminal by the first pre-charge transistor and configured to apply a first driver voltage and a second latching control line coupled to the second output terminal discharge transistor and configured to apply a second driver voltage to switch the second output terminal discharge transistor. In some such implementations, the apparatus is configured to discontinue the second driver voltage at a later time than the first driver voltage is discontinued such that the second output terminal discharge transistor controls the discharge of the first output terminal discharge transistor, thereby controlling a voltage level of the first output terminal. In some implementations, the apparatus is configured to maintain the voltage level of the first output terminal until a subsequent the first driver voltage is applied. In some implementations, the apparatus is configured to initiate the first driver voltage and the second driver clock voltage at a same time. In some implementations, each of the first pre-charge transistor, the first output terminal discharge transistor and the second output terminal discharge transistor is configured as two transistors coupled with a common gate.

Another innovative aspect of the subject matter described in this disclosure can be implemented in an apparatus having a plurality of MEMS devices arranged in an array and a control matrix that includes only n-type or only p-type transistors coupled to the plurality of MEMS devices to communicate data and drive voltages to the MEMS devices. For each MEMS device, the control matrix includes a latch that is configured to maintain a difference in voltage levels on a first output terminal and a second output. The latch includes a first pre-charge transistor and a first output terminal discharge transistor coupled to the first output terminal and a first latching control line coupled to the first output terminal by the first pre-charge transistor. The first output terminal discharge transistor is coupled to an electrode of the first latching control line. The apparatus can be configured to apply, to the first latching control line, a first driver voltage that changes from an intermediate voltage level that has a magnitude intermediate between a first voltage level and apply a second voltage level, to the second level voltage, from the second voltage level to the first voltage level, and from the first voltage level to the intermediate voltage level at a time that a voltage on the first output terminal changes from the first voltage level to the second voltage level. In some implementations, the latch is configured such that applying the first driver voltage changes a voltage level of the first output terminal from the first voltage level to the second voltage level. In some implementations, the first pre-charge transistor can be diode-connected transistor. In some implementations, the apparatus is a display apparatus and the MEMS device includes a shutter that is actuated based on the voltage levels on the first output terminal and the second output terminal.

Details of one or more implementations of the subject matter described in this specification are set forth in the accompanying drawings and the description below. Although the examples provided in this summary are primarily described in terms of MEMS-based displays, the concepts provided herein may apply to other types of displays, such as LCD, OLED, electrophoretic, and field emission displays, as well as to other non-display MEMS devices, such as MEMS microphones, sensors, and optical switches. Other features, aspects, and advantages will become apparent from the description, the drawings, and the claims. Note that the relative dimensions of the following figures may not be drawn to scale.

DETAILED DESCRIPTION

Certain display apparatus utilize latching circuits to control the actuation of the light modulators, such as mechanical shutters, employed by the display apparatus to generate images. These latching circuits are typically fabricated as complementary metal-oxide-semiconductor (CMOS) circuit using CMOS fabrication techniques in the art and including both N-MOS and P-MOS type transistors.

The CMOS manufacturing process for fabricating the latching circuits can be complex. For example, when fabricating a latching circuit using polycrystalline silicon-based transistors, the process can require up to six, and even as many as ten or more photo processes.

Apparatus and methods herein provide latching circuits, pixel circuits, and displays based on latching circuits that are fabricated from transistors of a single conductivity type (i.e., only n-type transistors or only p-type transistors). As a result, complexity of the manufacturing process for fabricating the latching circuits can be reduced. Timing schemes are described which can facilitate the latching of information in a comparatively shorter interval than existing latches.

In some implementations, the state of the light modulators in the display is set by selectively discharging one of two output terminals that might attract a light modulator. The discharge of each terminal is controlled by an output terminal discharge transistor. In some implementations, the latching circuit includes a separate pixel-level discharge transistor that prevents discharge of the output terminal charge through either output terminal discharge transistor until such discharge is desired. This transistor also helps isolate a retention capacitor that stores a voltage indicating the desired state of the pixel. Doing so prevents charge leakage and improves reliability.

Particular implementations of the subject matter described in this disclosure can be implemented to realize one or more of the following potential advantages. Fabricating a latch based on transistors of a single conductivity type can reduce the fabrication process by two or more photo processing steps, which can reduce the complexity of the manufacturing process. The circuits disclosed herein also may yield increased switching speed. Isolation of a data-storing retention capacitor also can reduce charge leakage and increased switching reliability. This results in improved image quality and consistency.

Figure 1:
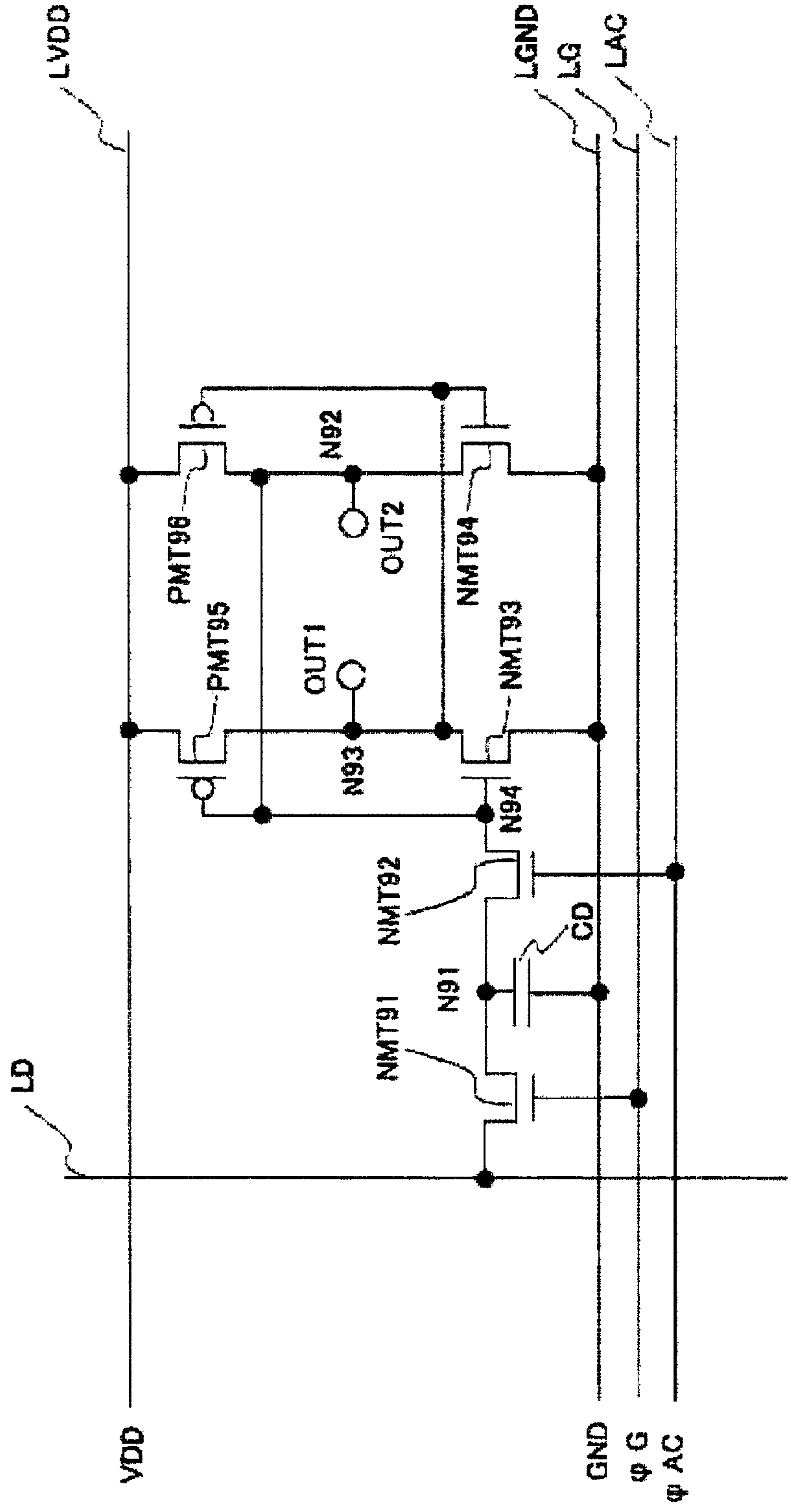
FIG. 1 shows an example latching circuit.

FIG. 1 shows an example latching circuit. The latching circuit is formed from transistors of both conductivity types. The latching circuit of FIG. 1 is typically formed from a coupled arrangement of n-type MOS transistors (NMT93 and NMT94) and p-type MOS transistors (PMT 95 and PMT96). The coupled arrangement of transistors is connected between a power line (LVDD), which supplies a uniform voltage VDD, and a power line (LGND), which supplies a ground voltage GND.

The latching circuit of FIG. 1 can be formed from polycrystalline silicon.

Figure 2:
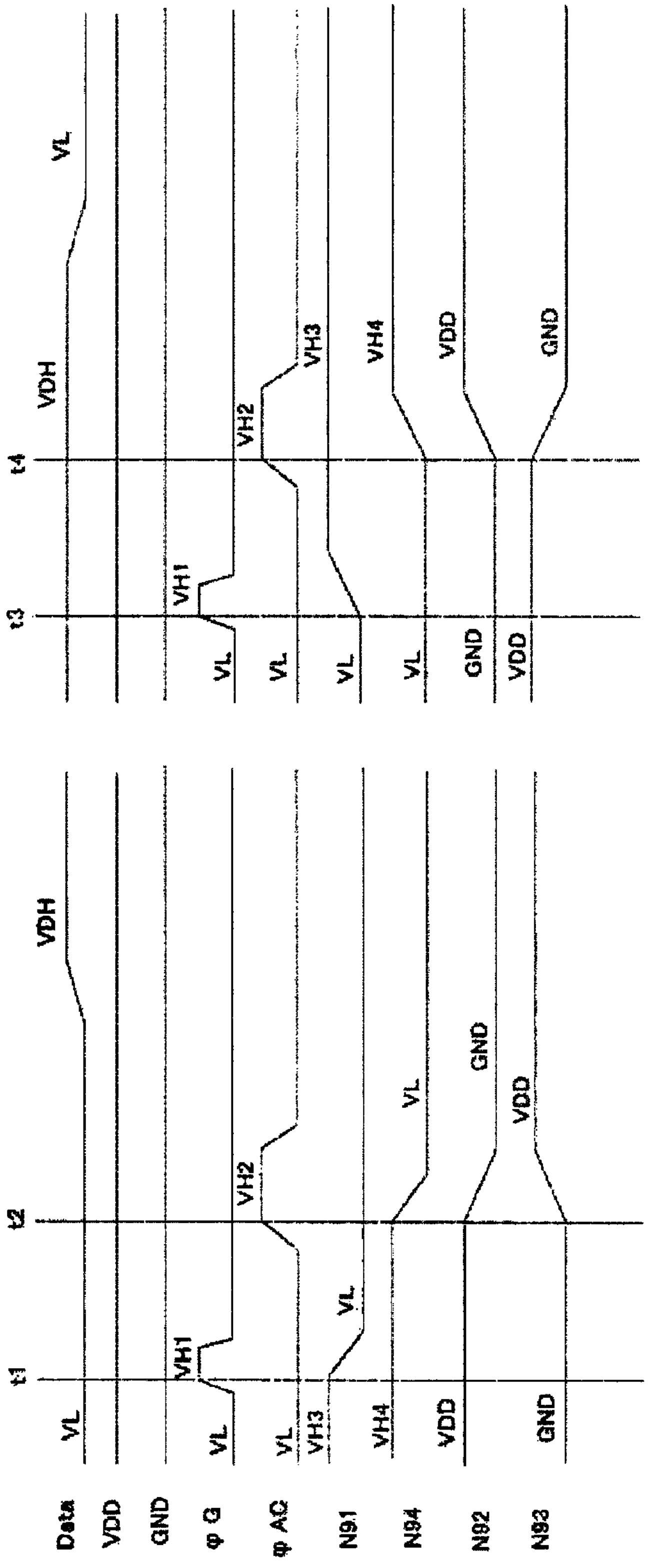
FIG. 2 shows an example timing diagram for operation of the latching circuit of FIG. 1.

FIG. 2 shows an example timing diagram for operation of the latching circuit of FIG. 1. The timing diagram depicts a time-sequence of voltages that can be applied to the latching circuit of FIG. 1 during operation, including a scanning voltage (ϕG) and a driver clock voltage (ϕAC). FIG. 2 also shows the time variation of the voltages at nodes N91, N92, N93 and N94 in the latching circuit of FIG. 1. Voltages VDD and GND are uniform.

The operation of the latching circuit of FIG. 1, when a data voltage at a low level voltage VL (also referred to herein as a L level voltage) is applied on the data line (LD), is as follows.

As shown in FIG. 2, at time t1, the scanning voltage (ϕG) on the scanning line (LG) is changed from a L level voltage VL to a high level voltage VH (referred to herein as a H level voltage). The n-type MOS transistor NMT 91 is switched ON, and the L level voltage (VL) on the data line (LD) is captured in a retention capacitor (CD). As a result, node N91 is at an L level voltage VL.

At time t2, the driver clock voltage (ϕAC) on the latching control line (LAC) is changed from an L level voltage (VL) to an H level voltage (VH2). As a result, n-type MOS transistor NMT92 is switched ON and node N94 is at the L level voltage (VL).

This causes the p-type MOS transistor PMT 95 and the n-type MOS transistor NMT 94 to be switched ON, and p-type MOS transistor PMT 96 and n-type MOS transistor NMT 93 to be switched OFF. At this point, node N92, i.e., the second output terminal (OUT 2), is at ground voltage GND, and node N93, i.e., the first output terminal (OUT 1), is at voltage VDD. As a result, the first output terminal (OUT1) is at an H level voltage and the second output terminal (OUT 2) is at an L level voltage.

The operation of the latching circuit of FIG. 1 when a data voltage at an H level voltage VDH is applied on the data line (LD) is as follows.

As shown in FIG. 2, at time t3, the scanning voltage (ϕG) on the scanning line (LG) is changed from an L level voltage VL to an H level voltage VH. The n-type MOS transistor NMT 91 is switched on and the data voltage (VDH) on the data line (LD) is stored in retention capacitor (CD). As a result, node N91 is at the H level voltage VH3.

At this time, the n-type MOS transistor NMT 93 and p-type MOS transistor PMT96 are switched ON, and p-type MOS transistor PMT95 and n-type MOS transistor NMT94 are switched OFF. Node N92, i.e., the second output terminal (OUT2), acquires voltage VDD. Node N93, i.e., the first output terminal (OUT1), acquires ground voltage GND. Therefore, the first output terminal (OUT1) acquires an L level voltage and the second output terminal (OUT2) acquires an H level voltage.

Figure 3:
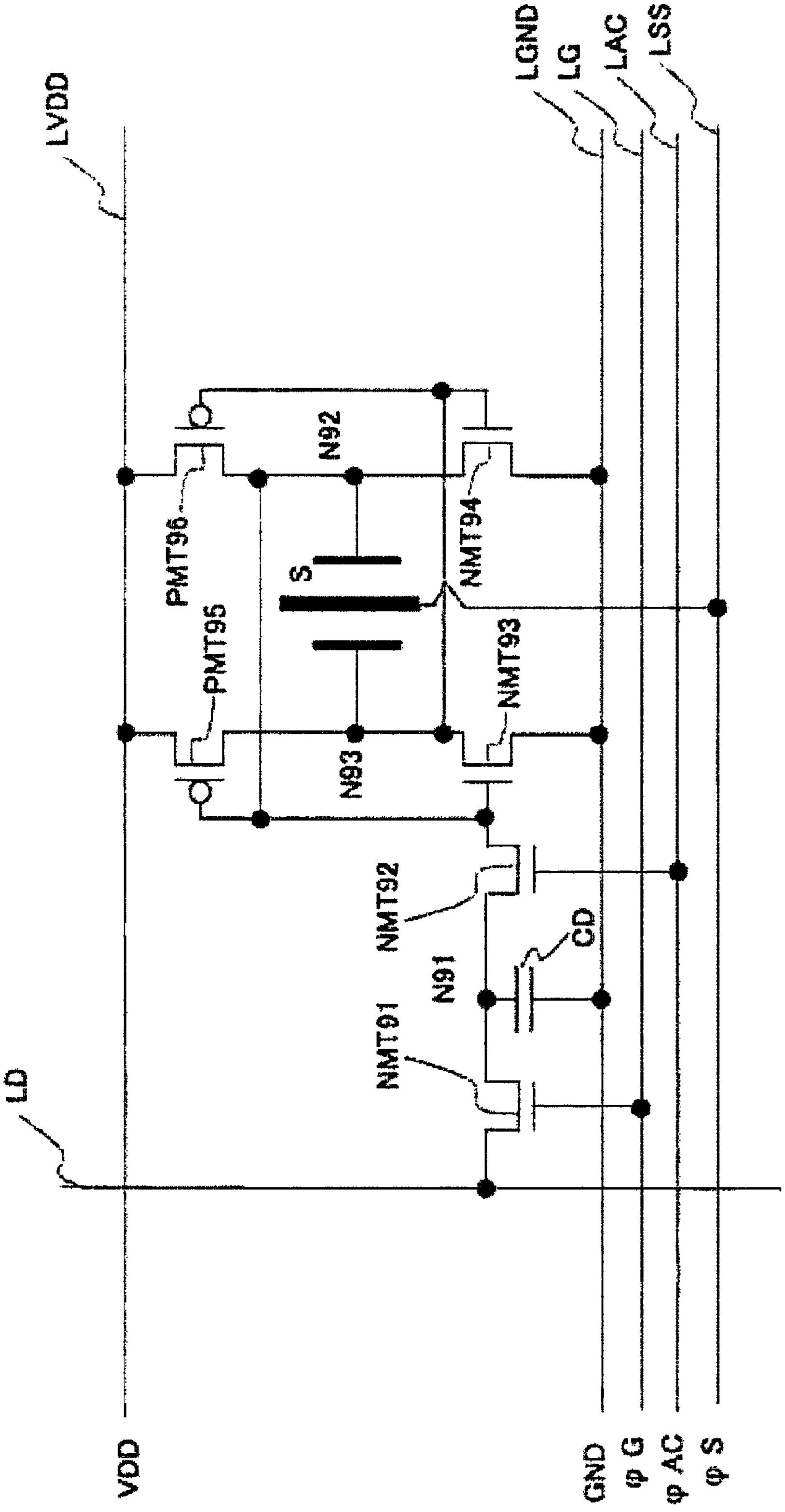
FIG. 3 shows an example pixel circuit that can be used in a display.

FIG. 3 shows an example pixel circuit that can be used in a display. The pixel circuit can be formed using the latching circuit of FIG. 1 and a movable shutter (S). The latching circuit is used to actuate each the movable shutter of a display. The latching circuits facilitate the display of images by the display by electrically actuating, i.e., controlling the position of, a movable shutter (S). The actuation of the movable shutter (S) is based on the voltage differences at the two output terminals of the latching circuits, i.e., the first output terminal (OUT 1) and the second output terminal (OUT 2), of the latching circuit. A movable shutter (S) may be referred to as a mechanical shutter. In an example, the display is a Micro Electro Mechanical Systems (MEMS) display.

In an example implementation, the latching circuit is used to actuate the movable shutter (S) so that it moves rapidly along the direction of the electrostatic forces applied based on the voltages of the output terminals. When node N92 (the second output terminal, OUT2) is at ground level voltage GND, node N93 (the first output terminal, OUT1) is at voltage VDD. Therefore, the movable shutter (S) moves rapidly towards node N93 (the first output terminal, OUT1). When node N92 (the second output terminal, OUT2) is at voltage VDD, node N93 (the first output terminal, OUT1) is at voltage GND. The movable shutter (S) moves rapidly towards node N92 (the second output terminal, OUT2).

The luminescent state and non-luminescent state of the pixels of a display can be controlled by the opening and closing the movable shutter (S). For example, the display can be a backlight display. When the movable shutter (S) moves towards node N92 (the second output terminal, OUT2), the light rays of the backlight display may be transmitted (thereby causing the pixel to be in a luminescent state). When the movable shutter (S) moves towards node N93 (the second output terminal, OUT1), the light rays of the back lit display are blocked (causing the pixel to be in a non-luminescent state).

The actuation of the movable shutter (S) facilitates image display by controlling the output of light rays from select pixels (similar to the control of output light rays by a liquid crystal layer in a liquid crystal display unit). As shown in FIG. 3, LSS is the control line of the movable shutter (S), and ϕS indicates the control signal applied to the movable shutter (S). The control signal (ϕS) of the movable shutter (S) can be a specified uniform voltage. The control signal (ϕS) also may be pulse voltage, such as in a reverse drive of a liquid crystal display unit.

Figure 4:
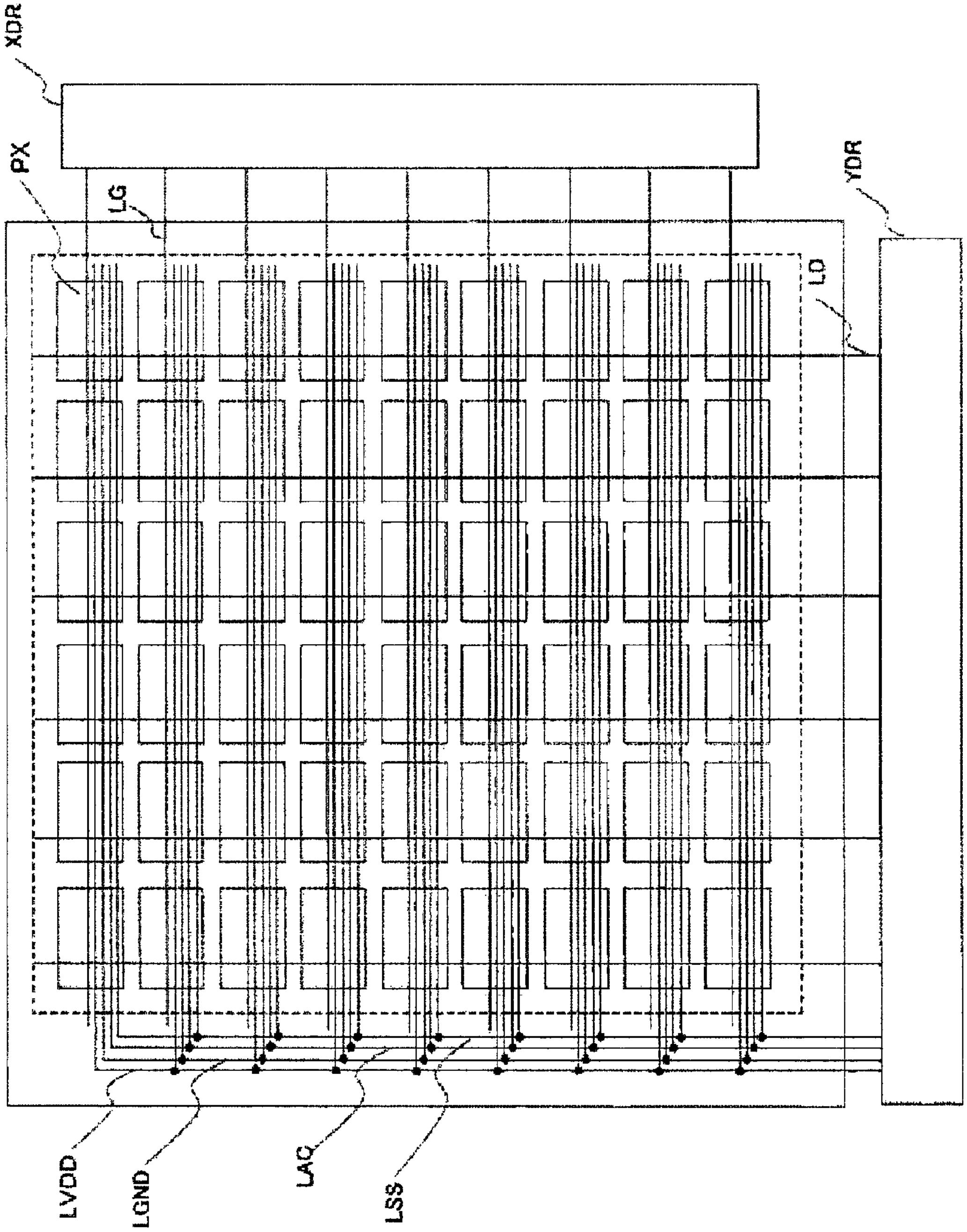
FIG. 4 shows a schematic of an example display.

FIG. 4 shows a schematic of an example display. Multiple pixels (PX) are positioned in a two-dimensional array, with each pixel component (PX) of the array including a movable shutter and a pixel circuit configured to actuate the movable shutter. The pixel circuits of the display can be formed from any of the latching circuits described herein.

In FIG. 4, the rows are sets of the scanning lines (LG) and are connected to a vertical drive circuit (XDR). The columns are sets of the data lines (LD) and are connected to the horizontal drive circuits (YDR).

The power lines (LVDD and LGND), the latching control lines (LAC) and shutter control lines (LSS) are common to all pixels, and are connected to the horizontal drive circuit.

An image is displayed during the display period after the data voltage on the data line (LD) is written to a given pixel in a given row within the writing period, and the movable shutter is moved towards one of the output terminals of the latching circuit during the movable shutter setting period (i.e., from time point t2 in FIG. 2 until the movable shutter is moved completely in a given direction).

Example of latching circuits that are formed from either only n-type MOS transistors or p-type MOS transistors are described below in connection with FIGS. 5-19. The latching circuits may be used to form pixel circuits, which can be arranged in an array to provide a display.

Figure 5:
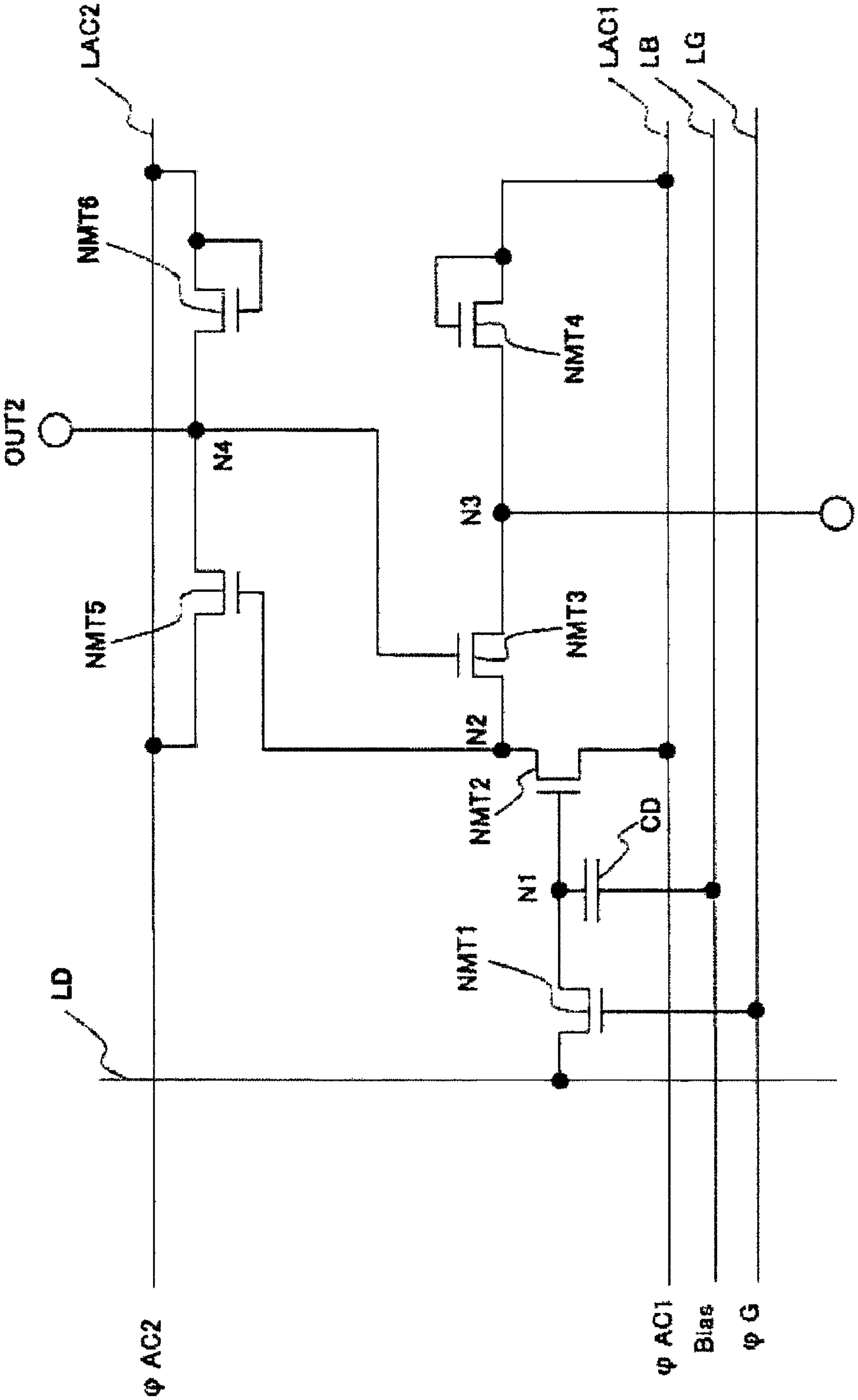
FIG. 5 shows an example latching circuit.

FIG. 5 shows an example latching circuit. More particularly, FIG. 5 shows an example of a latching circuit that is formed from a single type of transistor. In this example, the transistors are n-type MOS transistors (referred to herein using notation NMT*). For simplicity, the n-type MOS transistors are referred to herein simply as transistors. In an example, the transistors (NMT*) are formed using a polycrystalline silicon semiconductor layer.

As shown in FIG. 5, the latching circuit includes a retention capacitor (CD), a data line (LD), a scanning line (LG), a bias line (LB) to supply a bias voltage (Bias), a first latching control line LAC1 to supply a first driver clock voltage (ϕAC1), and a second latching control line LAC2 to supply a second driver clock voltage (ϕAC2). In an example, the bias voltage can be a fixed, uniform voltage.

Figure 6:
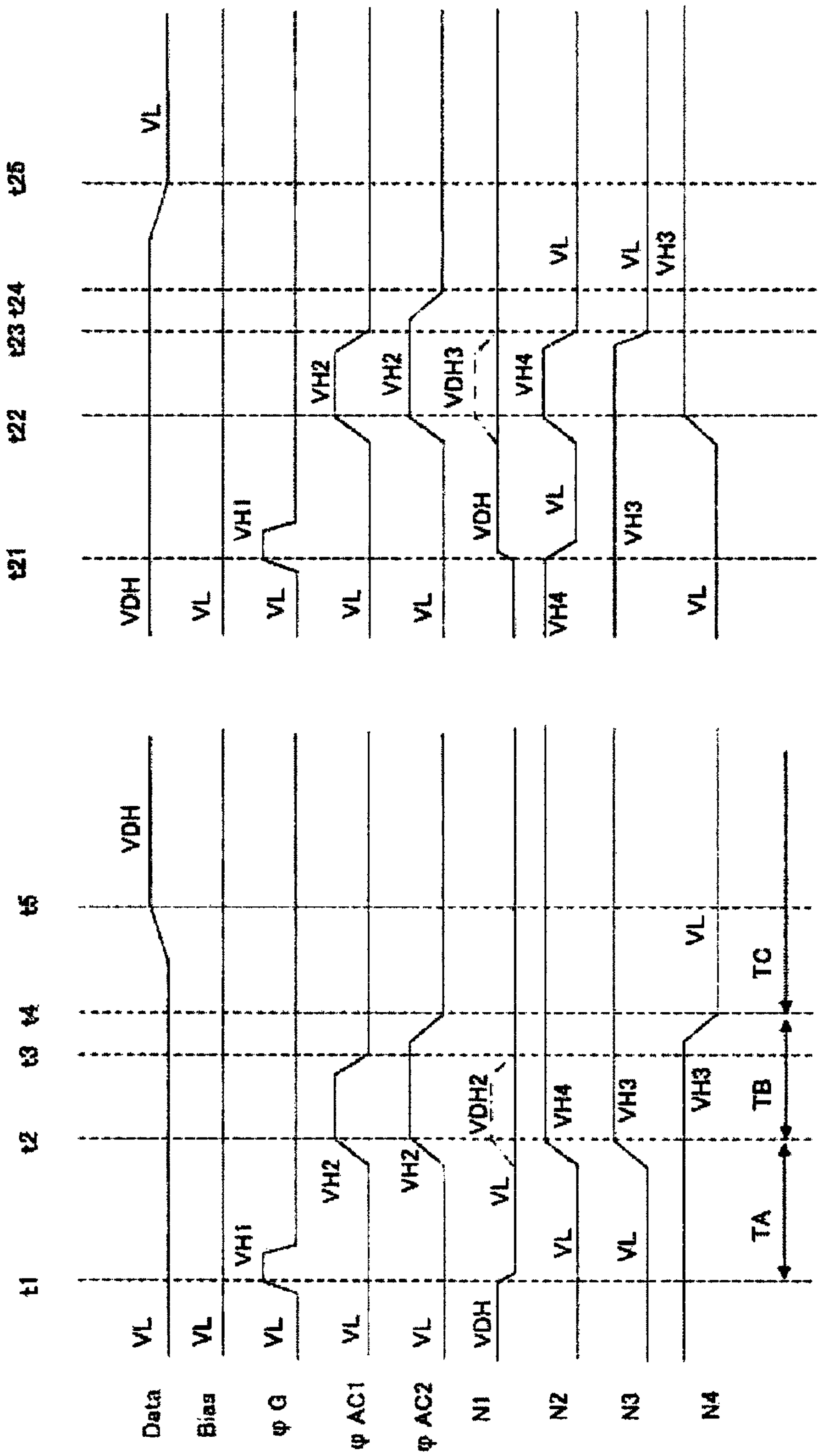
FIG. 6 shows an example timing diagram for operation of the latching circuit of FIG. 5.

FIG. 6 shows an example timing diagram for operation of the latching circuit of FIG. 5. For example, FIG. 6 shows the time variation of the scanning voltage (ϕG), the driver clock voltages (ϕAC1 and ϕAC2), and the voltages at nodes N1, N2, N3 and N4 of the latching circuit of FIG. 5.

A H level voltage or an L level voltage can be applied as the data voltage on the data line (LD). The L level and the H level voltages can correspond to data of either "0" or "1", respectively.

The operation of the example latching circuit of FIG. 5 when a data voltage at a L level voltage VL is applied on the data line (LD) is as follows.

At time t1, the scanning voltage (ϕG) is changed from an L level voltage VL to an H level voltage VH1. The scanning line (LG) is coupled to the gate of an input transistor (NMT1). Therefore, the H level voltage VH1 switches the input transistor (NMT1) ON and passes on the data voltage VL on the data line (LD) to node N1. Voltage VH1 can be expressed as: VH1≥VDH+Vth, where Vth is the threshold voltage of the n-type MOS transistors (NMT*) and VDH is the H level voltage on the data line (LD). For purposes of simplification, all of the n-type MOS transistors are considered to have the same threshold voltage Vth.

At time t2, the first driver clock voltage (ϕAC1) is supplied on the first latching control line (LAC1) and the second driver clock voltage (ϕAC2) is supplied on the second latching control line (LAC2). In the example of FIG. 6, the first driver clock voltage (ϕAC1) and the second driver clock voltage (ϕAC2) are supplied simultaneously. Also, in the example of FIG. 6, both the first driver clock voltage (ϕAC1) and the second driver clock voltage (ϕAC2) are H level voltages VH2. Each of transistors NMT4 and NMT6 can be a diode-connected transistor coupling node N3 and N4 to the latching control lines LAC1 and LAC2, respectively. As a result, both nodes N3 and N4 acquire a voltage of VH3 through transistors NMT4 and NMT6. That is, transistors NMT4 and NMT6 serve as pre-charge transistors for the respective nodes N3 and N4. Voltage VH3 can be expressed as: VH3=VH2−Vth, where VH2 is the level of the first driver clock voltage (ϕAC1) and the second driver clock voltage (ϕAC2).

Transistor NMT2 is switched OFF at time t2. Since node N4 is at an H level voltage VH3, transistor NMT3 is switched ON. Node N2 acquires the H level voltage VH4 after transistor NMT3 passes on the voltage from node N3. Voltage VH4 can be expressed as: VH4=VH3−Vth.

At time t3, the first driver clock voltage (ϕAC1) is changed to the L level voltage VL. Current cannot flow from node N3 to the first latching control line (LAC1), since it is against the direction of the diode-connected transistor (NMT4). Also, transistor NMT2 is switched OFF. As a result, the voltages of nodes N2 and N3 do not change.

At time t4, the second driver clock voltage (ϕAC2) is changed to an L level voltage VL. Node N2, which is connected to the gate of transistor NMT5, acquires an H level voltage VH4 (VH4>Vth). As a result, transistor NMT5 is switched ON and Node N4 acquires the L level voltage VL.

At this time, since the voltage of node N4 acquires the L level voltage VL, transistor NMT3 is switched OFF. The first output terminal (OUT1) of the latching circuit has the H level voltage VH3 of node N3 and the second output terminal (OUT2) has the L level voltage VL of node N4.

Transistors NMT3 and NMT5 serve as output terminal discharge transistors for the first output terminal (OUT1) and the second output terminal (OUT2), respectively. Transistor NMT2 serves as a pixel discharge transistor and can be used to control the discharge of both output terminals through the discharge transistors NMT3 and NMT5.

At time t5, the data voltage on the data line (LD) is changed from the L level voltage VL to the H level voltage VDH. However, the scanning voltage (ϕG) at time t5 is an L level voltage and so transistor NMT1 is switched OFF. Since the data voltage is not imported from the data line (LD), no further voltage variations occur in nodes N1, N2, N3 and N4.

The operation of the example latching circuit of FIG. 5 when a data voltage at a H level voltage VDH is applied on the data line (LD) is described below.

At time t21, scanning voltage (ϕG) on the scanning line (LG) is changed to an H level voltage VH1. Input transistor NMT1 is switched ON and the voltage of node N1 acquires the data voltage VDH (VDH>Vth). As a result, transistor NMT2 is switched ON and the voltage of node N2 changes to the L level voltage VL.

Since node (N2) is coupled to the gate of transistor NMT5, transistor NMT5 is switched OFF. Node N4 either remains at the L level voltage or acquires a voltage VL−ΔV1. Voltage ΔV1 is voltage variation that is imported to node N4 from the coupling capacitance of transistor NMT5 when it changes from the H level voltage VH4 to the L level voltage VL.

Since transistor NMT3 is switched OFF, node N4 remains at the L level voltage VL (or VL−ΔV1), and node N3 is maintained at the H level voltage VH3.

The voltage difference between the first output terminal (OUT1) (node N3) and the second output terminal (OUT2) (node N4) is essentially VH3−VL at time (t21) (i.e., the voltage offset ΔV1 has little to no affect on the actuation of the shutter based on the voltage difference between the output terminals of the latching circuit of FIG. 5.

At time t22, the first driver clock voltage (ϕAC1) and the second driver clock voltage (ϕAC2) are both changed to the H level voltage VH2, the voltage of nodes N3 and N4 acquire voltage VH3 (similar to the voltage at time t2). Since the voltage of node N1 is an H level voltage and transistor NMT2 is switched ON, the voltage of node N2 changes to the H level voltage VH4.

At time t23, the first driver clock voltage (ϕAC1) acquires the L level voltage VL. The transistor (NMT2) is switched ON. Since node (N4) is at an H level voltage VH3, transistor (NMT3) is switched ON. Nodes N2 and N3 acquire the L level voltage VL.

At time t24, the second driver clock voltage (ϕAC2) acquires the L level voltage VL. Since the voltage of node (N2) is the L level voltage VL, transistor (NMT5) is switched OFF. Current cannot flow from node (N4) to the second latching control line (LAC2), since it is against the direction of the diode-connected transistor (NMT6). As a result, the voltage of node (N4) does not change from the H level voltage VH3.

At this point, the first output terminal (OUT1) is at the L level voltage VL of node (N3), and the second output terminal (OUT2) is at the H level voltage VH3 of node (N4).

At time t25, the voltage on the data line (LD) is changed from the H level voltage VDH to the L level voltage VL. However, the scanning voltage (ϕG) is at the L level voltage VL, so input transistor (NMT1) does not switch ON. Therefore, the data voltage is not imported from the data line (LD), and no change occurs in the voltages of nodes (N1, N2, N3 and N4).

As described above, the example latching circuit of FIG. 5 can be operated as a latch if it is driven as described in connection with FIG. 6. That is, the latching circuit of FIG. 5 can be used to provide the latching function using transistors of only a single conductivity type (here, n-type MOS transistors). Also, using the timing scheme shown in FIG. 6, it is possible to latch information in a comparatively shorter period of time than a latching circuit that is formed using transistors of both conductivity types.

Figure 7:
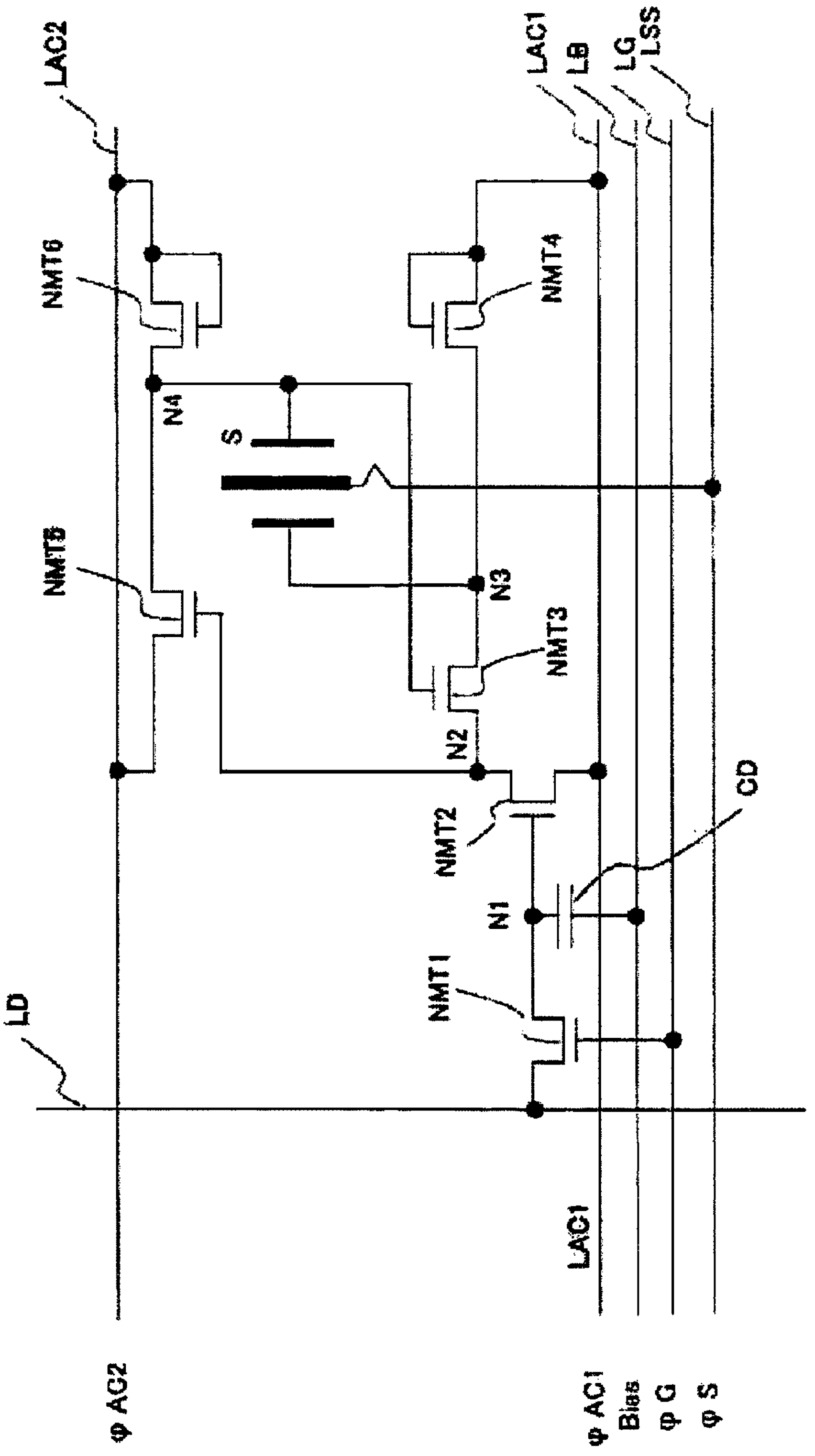
FIG. 7 shows an example latching circuit.

FIG. 7 shows an example latching circuit. More particularly, it is a latching circuit that is formed from the latching circuit of FIG. 5, and also includes a movable shutter control line (LSS) configured to connect to a shutter (S). The pixel circuit of FIG. 7 can be used to actuate the movable shutter (S). An array of pixel circuits of FIG. 7 can be used to form a display. The display can display images by electrically actuating the movable shutters (S) associated with each pixel, using the voltage difference between the outputs of the corresponding latching circuit.

A display that includes a latching circuit described herein can be used to display color images using a field sequential approach. The field sequential display approach is based on a viewer's perception of light emitted by three subpixels. In this example, each pixel circuit described herein can be used to form a subpixel. Each subpixel corresponds to a primary color (Red (R), Green (G), and Blue (B)). In an example, the subpixels can display secondary colors. Each of these subpixels serves as a source of the light of a different color and intensity. Entire fields of a certain primary color, but with intensity varying over the image plane, can be displayed to a viewer sequentially. If the different primary color components of an image are displayed in rapid succession, the viewer's brain merges the primary color components into a single image, thereby forming a single unitary color image having the intended color composition. In an example, a frame of 1/60 Hz can be divided into sub-frames that displays the R, G and B colors (or secondary colors). The intensity of each pixel would be based on the length time a sub-pixel is in a luminescent state.

The example latching circuit of FIG. 5 differs from a CMOS circuit that uses transistors of both conductivity types in that the example of FIG. 5 dynamically retains the H level and the L level voltages on the output terminals. The dynamically retained charge can leak in a current of the MOS transistor, even in the OFF state, e.g., if it is held for a long period of time. That may result in unstable actuation of the movable shutter (S) due to voltage variations. Since the pixel circuit of FIG. 7 can be configured to periodically reset the movable shutter display, the voltages and retention periods can be controlled.

An example use of the pixel circuit of FIG. 7 in a display is as follows. The movable shutter (S) is moved towards node (N3) or node (N4) during the movable shutter resetting period (TB in FIG. 6), after the data voltage is supplied to the data line (LD) for any pixel in any row within the writing period (TA in FIG. 6). An image is displayed during the display period (TC in FIG. 6). In an example, the resetting of the movable shutter (S) may take longer that shown in FIG. 6. For example, the resetting period can be longer in duration than period TB. That is, the switching time for a display period may differ from the time interval between t4 and t5 in FIG. 6.

Figure 8:
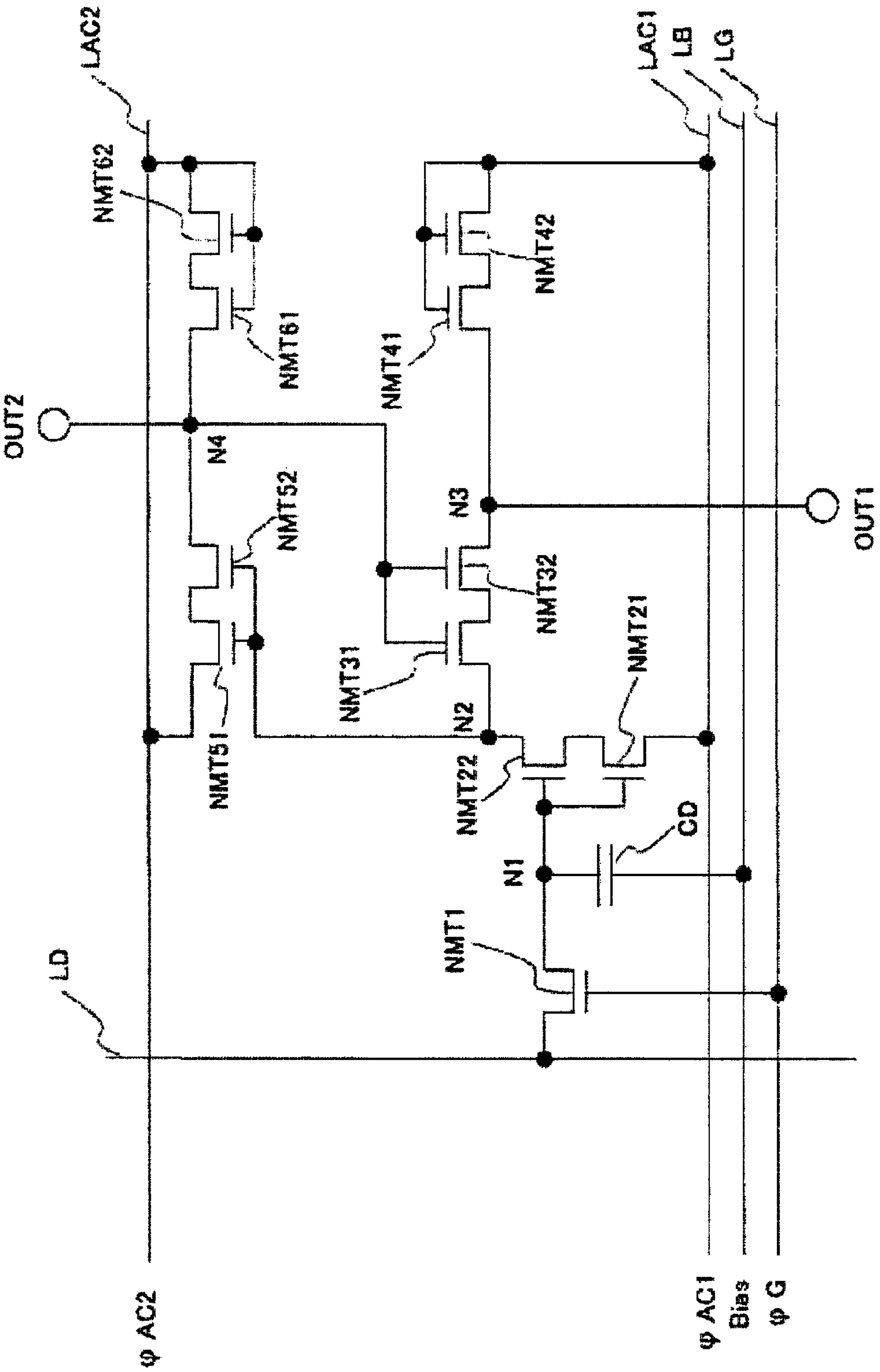
FIG. 8 shows another example latching circuit.

FIG. 8 shows another example latching circuit. It is based on the circuit of FIG. 5.

The latching circuit of FIG. 8 is formed from substituting each of the five (5) n-type MOS transistors of FIG. 5, namely NMT2, NMT3, NMT4, NMT5 and NMT6, with two (2) transistors that are coupled using a common gate connection. For example, transistor (NMT2) of FIG. 5 is substituted with transistor (NMT21) and transistor (NMT22), which are connected with a common gate (and therefore receive the same gate voltage). Transistors NMT3, NMT4, NMT5 and NMT6 of FIG. 5 each can be similarly substituted with double transistors coupled with a common gate connection, as shown in FIG. 8.

With the double-gate transistor structure, the latching circuit of FIG. 8 can handle higher voltages and can have a higher effective resistance to source-to-drain leakage.

The example of FIG. 8 does not show a double transistor substitution for transistor NMT1. The single transistor NMT1 used in the example of FIG. 8 can be is sufficient for passing an H level voltage (VDH) to node (N1). However, in another example implementation, input transistor NMT1 may be substituted with a double transistor.

The latching circuit in the example of FIG. 8 shows that all of the transistors NMT2, NMT3, NMT4, NMT5, and NMT6 of FIG. 5 can be substituted with double transistors. However, in another example, only one of the transistors NMT2, NMT3, NMT4, NMT5, and NMT6 is substituted with a double transistor. In another example, two or more of the transistors NMT2, NMT3, NMT4, NMT5, and NMT6 can be substituted with double transistors.

Figure 9:
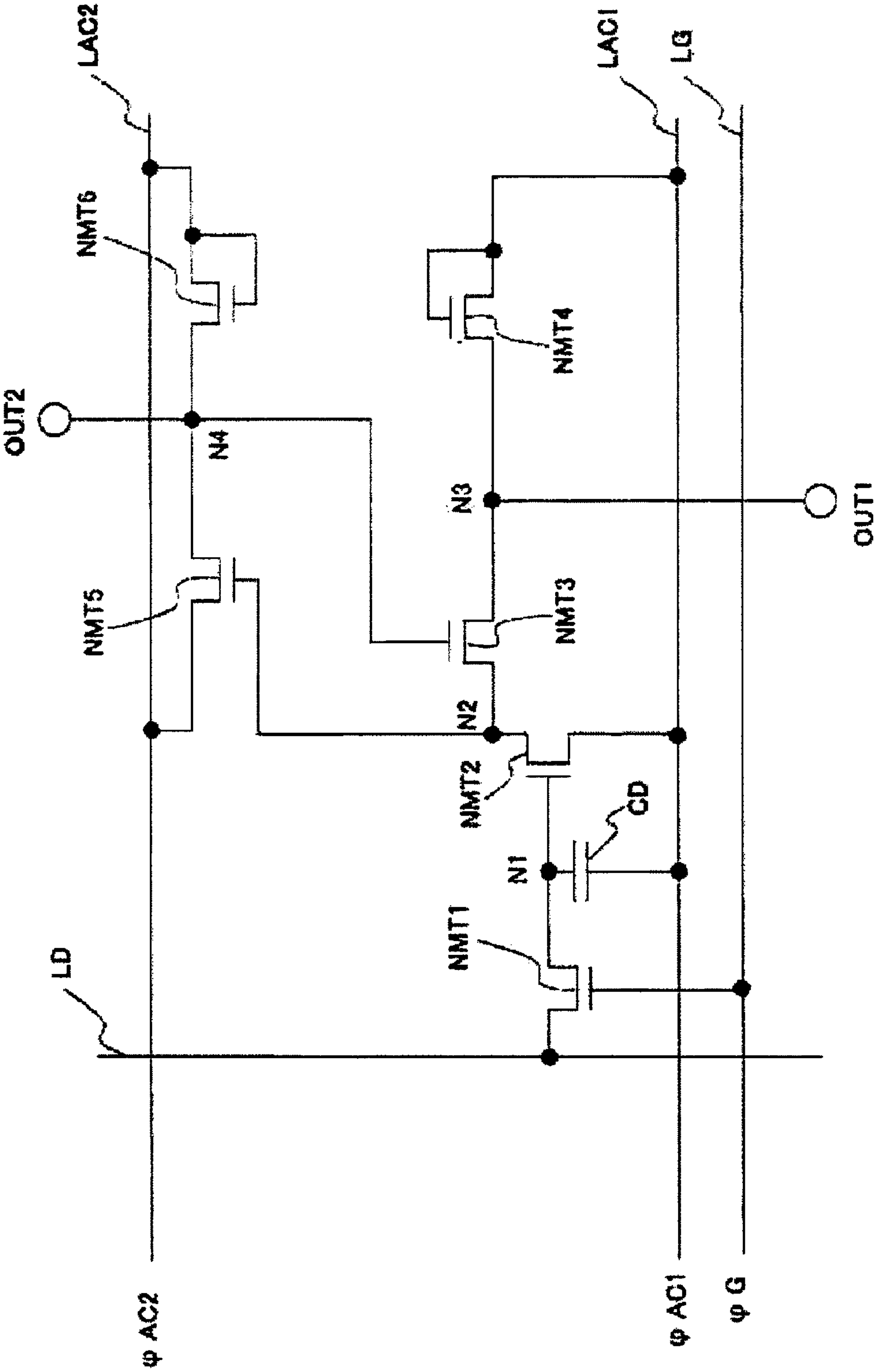
FIG. 9 shows another example latching circuit.

FIG. 9 shows another example latching circuit.

In this example, the bias line (LB) that supplied the bias voltage (Bias) in FIGS. 5 and 8 is eliminated. The retention capacitor (CD) is connected to the first latching control line instead (as shown FIG. 9).

Since the voltage on node (N1) is now based on the changes in the first driver clock voltage (ϕAC1), e.g., from an L level voltage VL to an H level voltage VH2, it increases from voltage VL to voltage VDH2 or from voltage VDH to voltage VDH3 according to the following formulae:

$$VDH2=VL+(VH2-VL)\times CD/(CD+CS) \quad (1)$$

$$VDH3=VDH+(VH2-VL)\times CD/(CD+CS) \quad (2)$$

Here, CS represents an increase in capacitance over the retention capacitor (CD) at node (N1). As described above in connection with FIG. 5, transistor (NMT2) functions mainly when the first driver clock voltage (ϕAC1) acquires an H level voltage and again when the first driver clock voltage (ϕAC1) is reduced to an L level voltage. That is, the voltage of the first driver clock voltage (ϕAC1) may go lower than the H level voltage VDH of node (N1) at about time t3 and time t23 (shown in FIG. 6) or later.

The voltage variation at node (N1) due to the first driver clock voltage (ϕAC1) changing from the L level voltage VL to the H level voltage VH2 has little or no effect on the operations of the latching circuit. That is, the latching circuit of the example of FIG. 9 exhibits similar latching behavior as any other latching circuit described herein. Eliminating the bias line (LB) can simplify the wiring layout for the circuit, and thereby can reduce the complexity of the fabrication process.

Figure 10:
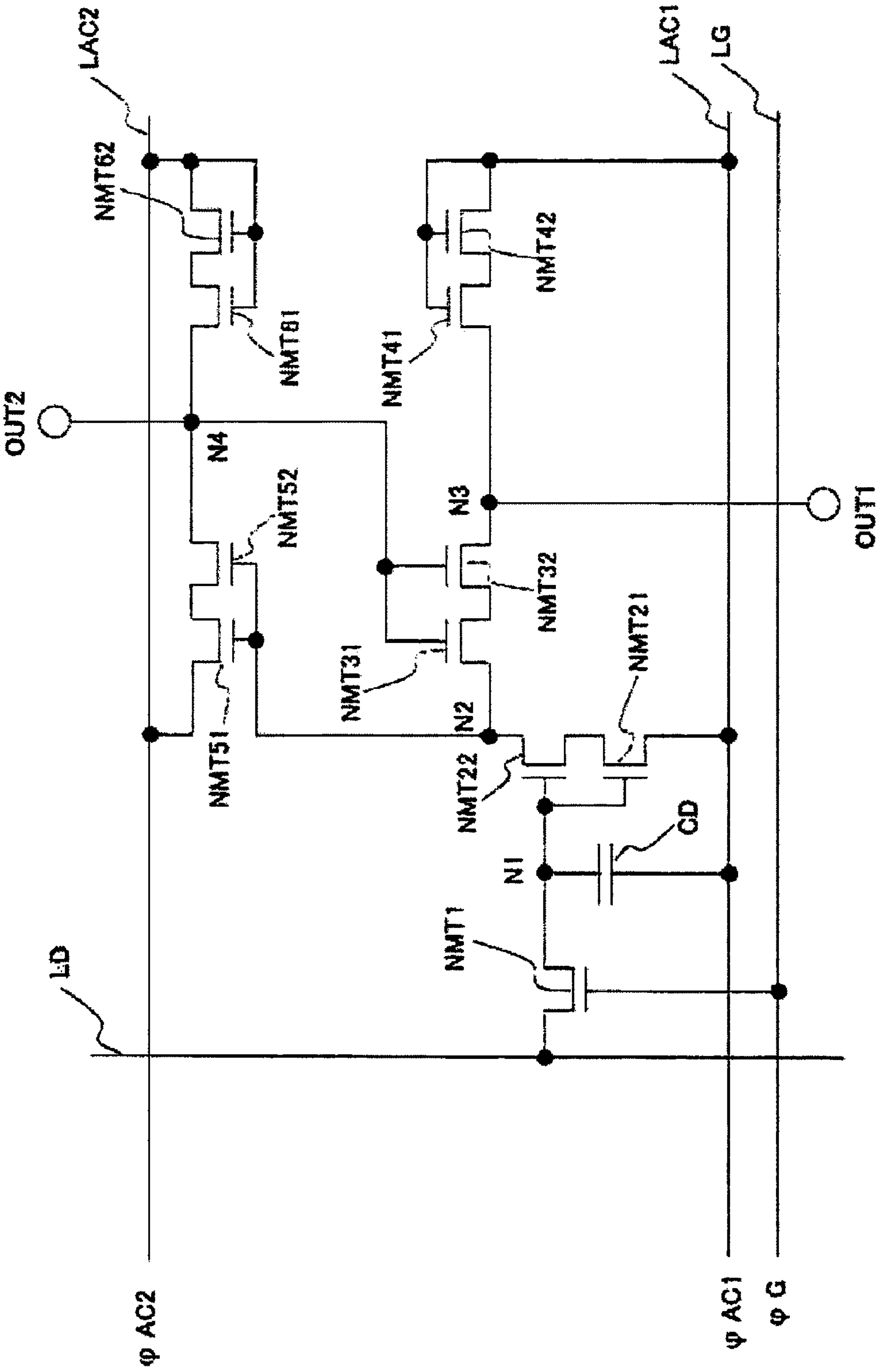
FIG. 10 shows another example latching circuit.

FIG. 10 shows another example latching circuit. It is based on the example of FIG. 9.

In this example, each of the five (5) n-type MOS transistors of FIG. 9, namely transistors NMT2, NMT3, NMT4, NMT5 and NMT6, is substituted with two (2) transistors that are coupled using a common gate connection. For example, transistor (NMT2) is substituted with transistor (NMT21) and transistor (NMT22) which share a common gate (and therefore receive the same gate voltage). Transistors NMT3, NMT4, NMT5 and NMT6 of FIG. 10 each can be similarly substituted with double transistors connected with a common gate, as shown in FIG. 9.

With the double-gate transistor structure, the latching circuit of FIG. 10 can handle higher voltages and has a higher effective resistance to source-to-drain leakage.

The example of FIG. 10 does not show a double transistor substitution for transistor NMT1. The single transistor NMT1 used in the example of FIG. 8 can be sufficient for passing an H level voltage (VDH) to node (N1). However, in another example implementation, input transistor NMT1 may be substituted with a double transistor.

The latching circuit in the example of FIG. 10 shows that all of the transistors NMT2, NMT3, NMT4, NMT5 and NMT6 of FIG. 5 can be substituted with double transistors. However, in another example, only one of the transistors NMT2, NMT3, NMT4, NMT5 and NMT6 is substituted with a double transistor. In another example, two or more of the transistors NMT2, NMT3, NMT4, NMT5 and NMT6 are substituted with double transistors.

Figure 11:
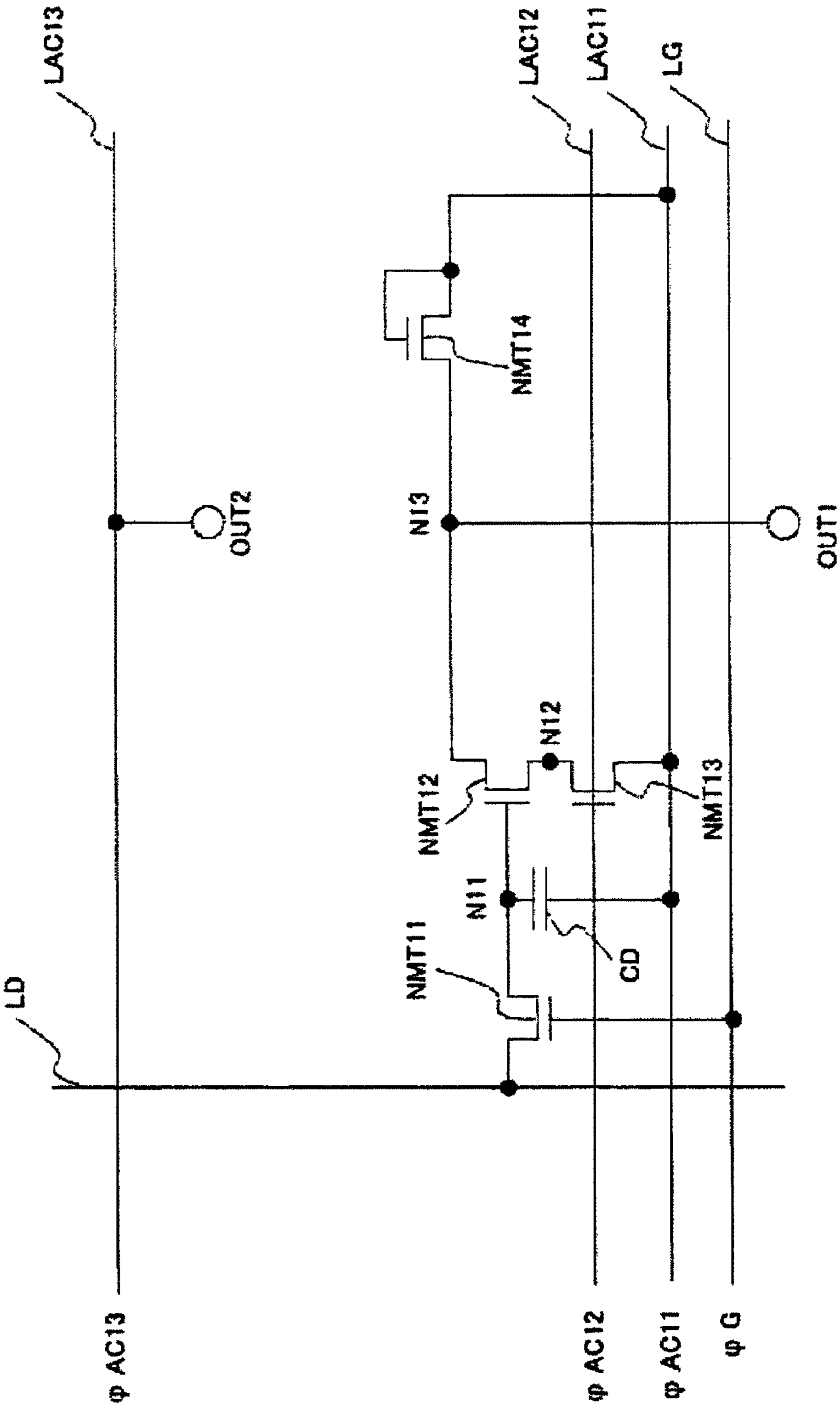
FIG. 11 shows another example latching circuit.

FIG. 11 shows another example latching circuit. Previous examples were based on a differential latching circuit with two (2) reverse outputs (the first output (OUT1) and the second output (OUT2)). The example of FIG. 11 is based on a different configuration of output terminals.

Figure 12:
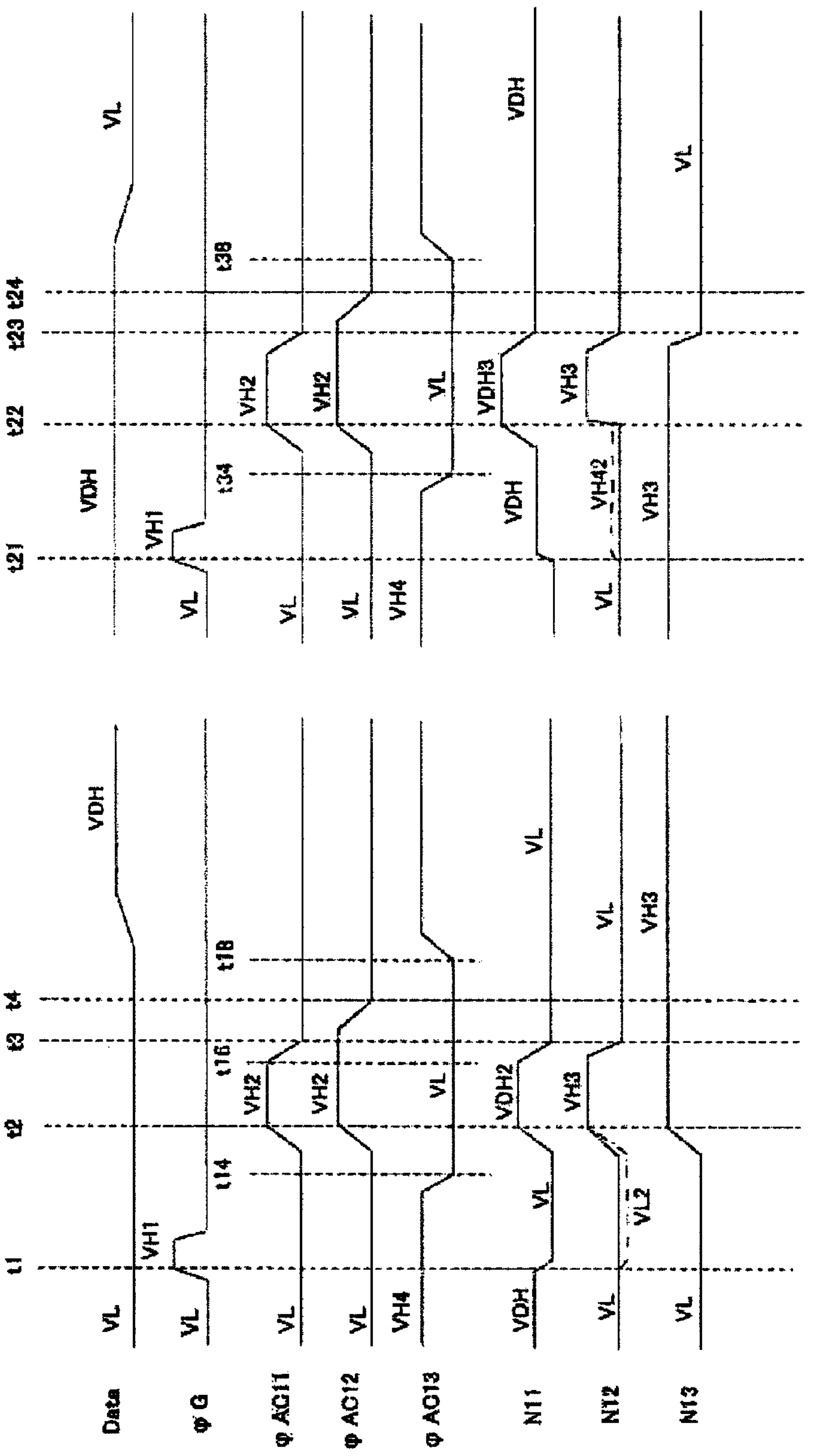
FIG. 12 shows an example timing diagram for operation of the latching circuit of FIG. 11.

FIG. 12 shows an example timing diagram for operation of the latching circuit of FIG. 11. The example timing diagram of FIG. 12 shows the time variation of the scanning voltage (ϕG), the first driver clock voltage (ϕAC11), the second driver clock voltage (ϕAC12), and the voltages at nodes N11, N12 and N13 of FIG. 11.

The operation of the example latching circuit of FIG. 11 when a data voltage at a L level voltage VL is applied on the data line (LD) is as follows.

At time t1, the scanning voltage (ϕG) on the scanning line (LG) is changed from a L level voltage VL to a H level voltage VH1, input transistor NMT11 is switched ON and the voltage of node (N11) acquires the data voltage VL on the data line (LD).

If node (N11) previously was at an H level VDH, the voltage in node (N12) is reduced from VL to VL2 (a shown in FIG. 12) due to the gate capacitance of transistor (NMT12). The voltage difference ΔV2 from VL to VL2 of node (N12) can be expressed using the following formula:

$$\Delta V2=(\mathrm{VDH}-\mathrm{VL})\times Cg/(Cg+CS11) \qquad (3)$$

Here, Cg is gate capacitance of transistor (NMT12), and CS11 is the capacitance of node (N11) over gate capacitance Cg.

There is a similar variation at node (N13). However, the voltage drop in node (N13) can be less. Since node (N13) has a load capability connected to the first output terminal (OUT1), a parasitic capacitance of the diode-connected transistor can be eliminated.

At time t2, the first driver clock voltage (ϕAC11) on the first latching control line (LAC11) and the second driver clock voltage (ϕAC12) on the second latching control line (LAC12) is changed from a L level voltage VL to a H level voltage VH2.

As shown in the example of FIG. 12, the second driver clock voltage (ϕAC12) is increased to an H level voltage before the first driver clock voltage (ϕAC11) starts to drop from an H level voltage at time (t16). In addition, while FIG. 12 shows that the first driver clock voltage (ϕAC11) and the second driver clock voltage (ϕAC12) are changed from the L level voltage VL to the H level voltage VH2 substantially simultaneously, it is not required. Any timing structure in which the second driver clock voltage (ϕAC 12) reaches a H level voltage after the first driver clock voltage (ϕAC11) reaches a H level voltage is applicable. With this timing scheme, a drain avalanche that can occur by the reverse current from node (N12) to the first latching control line (LAC11) is avoided.

At time t2, the voltage of node (N11) is raised to the H level voltage VDH2 based on the charge on retention capacitor (CD). Here, VDH2 can be represented similarly to formula (1) above.

Node (N13) acquires a voltage VH3 (VH3=VH2−Vth), where the H level voltage VH2 of the first driver clock voltage (ϕAC11) is reduced by the value of the threshold voltage Vth of transistor (NMT14).

Node (N12) acquires a voltage VH3, where the H level voltage VH2 of the first driver clock voltage (ϕAC11) is reduced by only the threshold value Vth of transistor (NMT14), since the transistor (NMT13) is switched ON.

At time t3, the first driver clock voltage (ϕAC11) changes from an H level voltage VH2 to an L level voltage VL. The voltage of node (N11) acquires an L level voltage VL and transistor (NMT12) is switched OFF.

Subsequently, the voltage of node (N13) is maintained at an H level voltage VH3. Since the transistor (NMT13) is switched ON, node (N12) acquires an L level voltage VL.

At time t4, the second driver clock voltage (ϕAC 12) is changed from an H level voltage VH2 to an L level voltage VL. Node (N12) is maintained at voltage VL since transistor (NMT1) is switched OFF. From time t4 onwards, the first output terminal (OUT1) remains at the H level voltage VH3.

The operation of the example latching circuit of FIG. 11 when a data voltage at a H level VDH is applied on the data line (LD) is described below.

At time t21, scanning voltage (ϕG) on the scanning line (LG) is changed from an L level voltage VL to an H level voltage VH1. Input transistor (NMT11) is switched ON and the voltage of node (N11) acquires the data voltage VDH.

The voltage of node (N12) becomes VH42, which is voltage VDH reduced by the threshold voltage Vth of transistor (NMT11), based on the infusion of electric charge from node (N13) since transistor (NM12) is switched ON. The voltage of Node (N13) is also reduced by an amount based on this emission. However, this is not shown in FIG. 12 due to the high capacitance of node (N13).

At time t22, the first driver clock voltage (ϕAC11) and the second driver clock voltage (ϕAC12) are simultaneously changed to a H level voltage VH2 from a L level voltage VL. As previously mentioned, the first driver clock voltage (ϕAC11) and the second driver clock voltage (ϕAC12) need not be raised simultaneously. However, for applicable timing schemes, the second driver clock voltage (ϕAC12) reaches an H level voltage after the first driver clock voltage (ϕAC11) is brought to an H level voltage. This can eliminate a drain avalanche that can occur due to a reverse current from node (N12) to the first latching control line (LAC11).

At this time, the voltage of node (N11) is changed to an H level VDH3 based on the charge on retention capacitor (CD). Voltage VDH3 can be determined using formula (2) above.

Node (N13) acquires the voltage VH3 (VH3=CH2−Vth), which is the H level voltage VH2 of the first driver clock voltage (ϕAC11) reduced by the threshold voltage Vth of transistor (NMT14).

Node (N12) also acquires the H level voltage VH3, which is the H level voltage VH2 of the first driver clock voltage (ϕAC11) reduced by the threshold voltage Vth of transistor (NMT13) (since transistor (NMT13) is switched ON).

At time t23, the first driver clock voltage (ϕAC11) is changed from an H level voltage VH2 to an L level voltage VL. Transistor (NMT13) is switched ON. The voltage applied to node (N11), and at the gate electrode of transistor (NMT12), changes from VDH3 to VDH, with transistor (NMT12) remaining switched ON. Therefore, node (N13) is connected with the first latching control line (LAC11)

through transistor (NMT12) and transistor (NMT13) and acquires an L level voltage VL. Since transistor (NMT13) is switched ON, node (N12) also acquires voltage VL.

At time t24, the second driver clock voltage (ϕAC12) is increased from an H level voltage VH2 to an L level voltage VL. Transistor (NMT13) is switched OFF and nodes (N12 and N13) are maintained at voltage VL.

From time t24 onwards, the first output terminal (OUT1) remains at the L level voltage VL.

The latching capability is likewise possible by interchanging the positions of transistor (NMT12) and transistor (NMT13).

The latching circuit of FIG. 11 can be used to form a pixel circuit of a display to actuate a movable shutter by introducing a second output terminal (OUT2) that is directly controlled by a third driver clock voltage (ϕAC3) supplied by the third latching lines (LAC13) (as shown in FIG. 11).

At time t14, the third driver clock voltage (ϕACI3) on the third latching control line (LAC13) is changed from an H level voltage VH4 to an L level voltage VL. At time t18, the third driver clock voltage (ϕAC13) is changed from an L level voltage VL to an H level voltage VH4. Similarly, at time t34, the third driver clock voltage (ϕAC13) is changed from an H level voltage VH4 to an L level voltage VL, and, at time t38, changed from an L level voltage VL to an H level voltage VH4.

The movable shutter (S) is moved towards the first output terminal (OUT1) when the first output terminal (OUT1) acquires the H level voltage VH3 between times t14 and time t18. At time t18, the position of the movable shutter (S) remains unchanged even though the second output terminal (OUT2) acquires to an H level voltage VH4.

The movable shutter (S) does not move between time t34 and time t38 while the first output terminal (OUT1) is at the L level voltage of VL. At time t34, the movable shutter (S) moves towards the second output terminal (OUT2) when the second output terminal (OUT2) acquires an H level voltage VH4.

Figure 13:
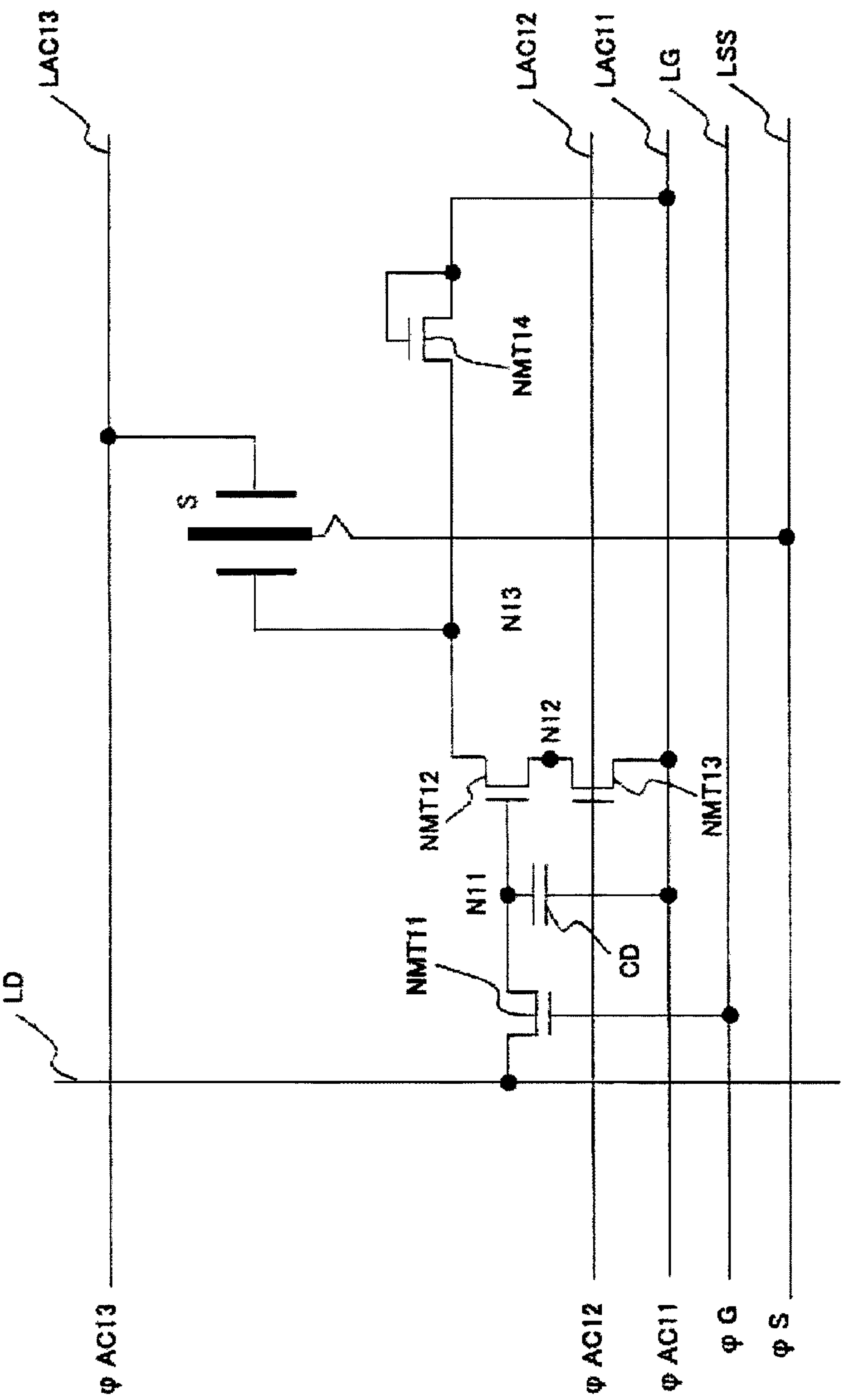
FIG. 13 shows an example pixel circuit.

FIG. 13 shows an example pixel circuit. The pixel circuit of FIG. 13 is based on the latching circuit of FIG. 11 and can be used to actuate a movable shutter (S).

In the example of FIG. 11, and as described below in connection with FIGS. 14, 15 and 16, the bias line may be eliminated, and the retention capacitor (CD) can be connected to the first latching control line (LAC1) instead.

Figure 14:
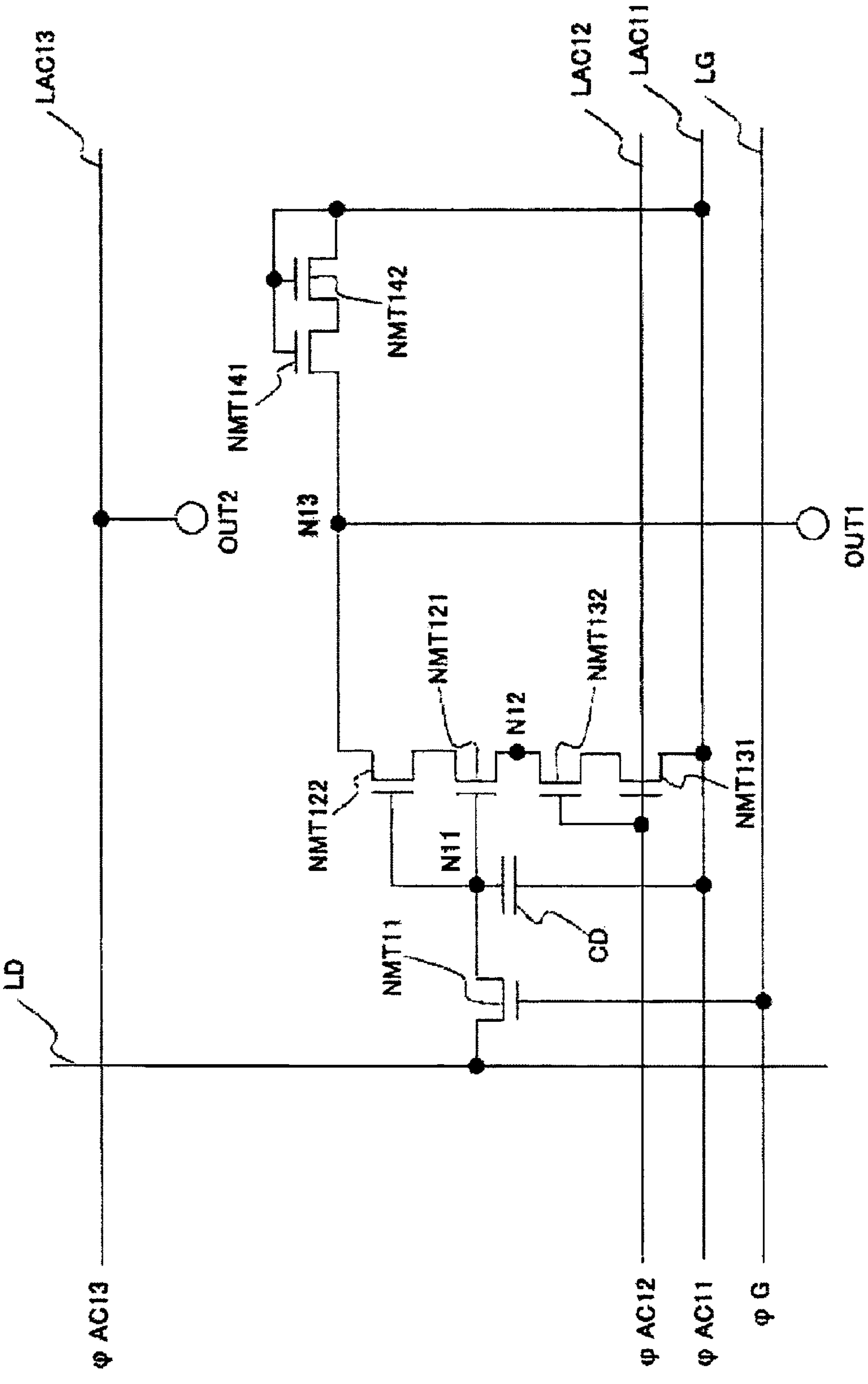
FIG. 14 shows another example latching circuit.

FIG. 14 shows another example latching circuit.

In this example, each of the three (3) n-type MOS transistors NMT12, NMT13 and NMT14, are substituted with two (2) transistors that are coupled using a common gate connection. For example, transistor (NMT12) of FIG. 11 can be substituted with transistor (NMT121) and transistor (NMT122), which are connected with a common gate (and therefore receive the same gate voltage). Either transistor NMT13 or transistor NMT14, or both transistor NMT13 and transistor NMT14, can be similarly substituted with double transistors connected with a common gate, as shown in FIG. 14.

With the double-gate transistor structure, the latching circuit of FIG. 14 can handle higher voltages and has a higher effective resistance to source-to-drain leakage.

The example of FIG. 14 does not include a double transistor substitution for transistor NMT11. The single transistor NMT11 used in the example of FIG. 14 can be sufficient for passing an H level voltage (VDH) to node (N11). In another example, input transistor NMT11 may be substituted with a double transistor.

Figure 15:
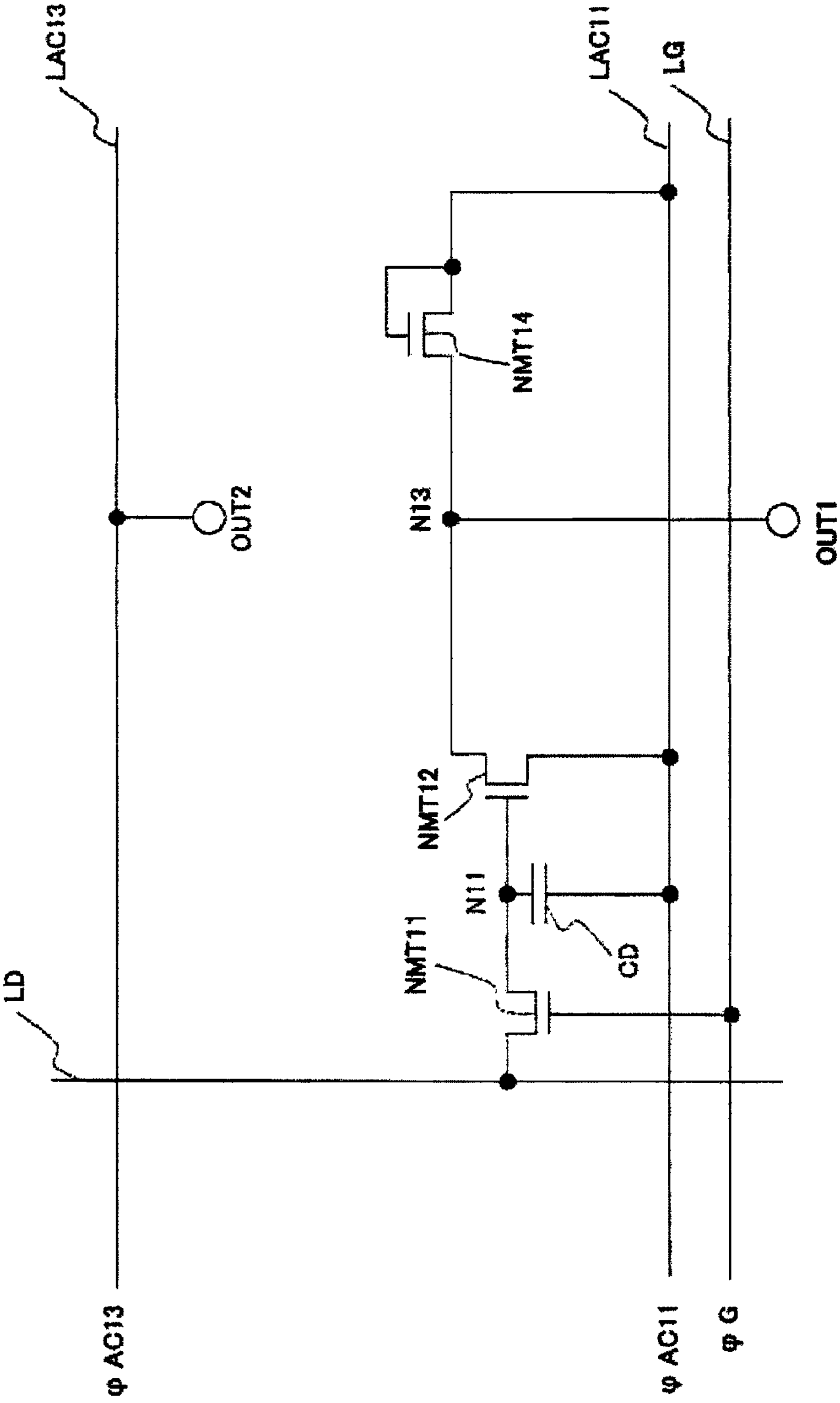
FIG. 15 shows another example latching circuit.

FIG. 15 shows another example latching circuit.

In this example, transistor (NMT13) and the second latching control line (ϕACI2) are eliminated from the latching circuit. The first electrode of transistor (NMT12) is connected to the first latching control line (LAC11).

Figure 16:
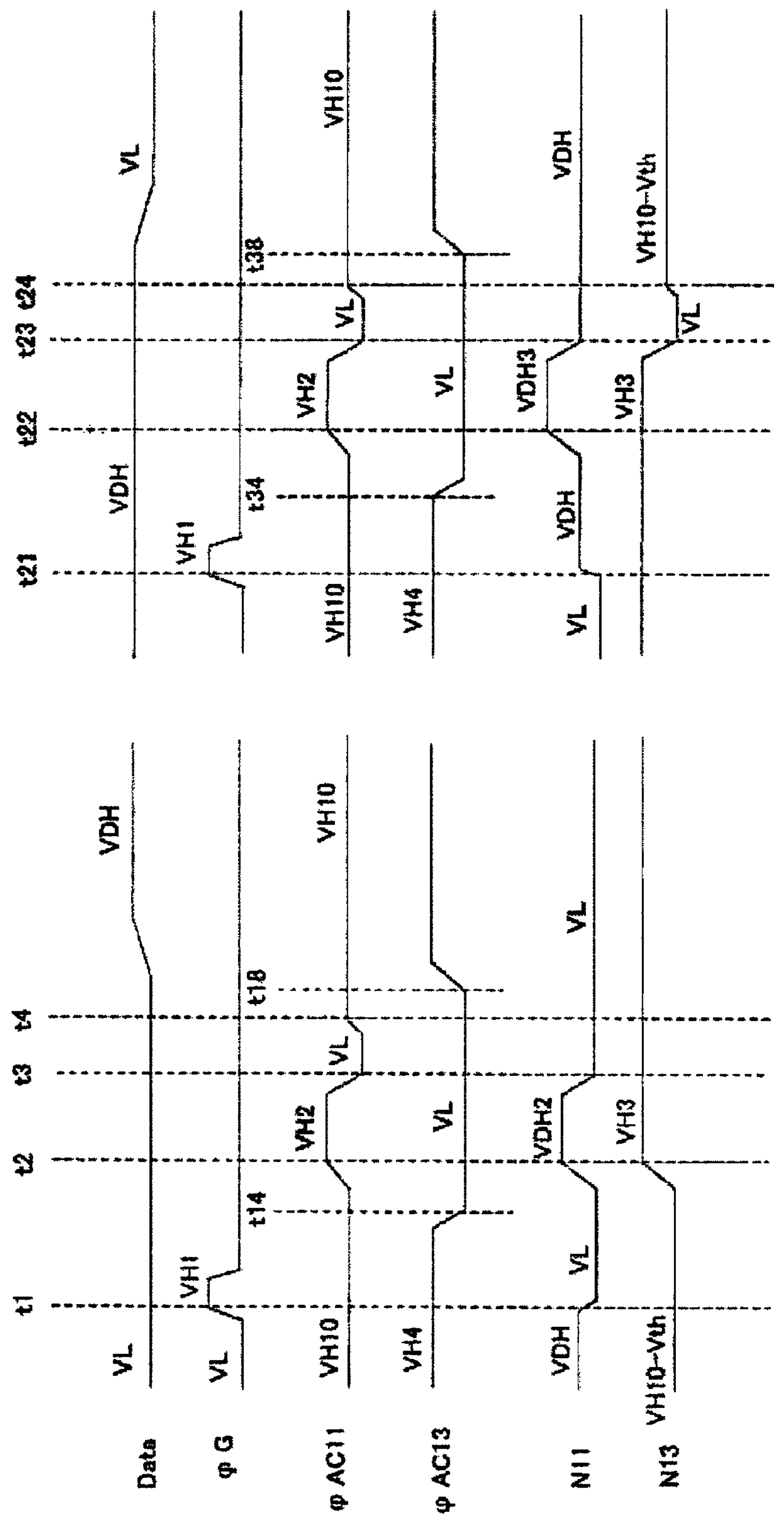
FIG. 16 shows an example timing diagram for operation of the latching circuit of FIG. 15.

FIG. 16 shows an example timing diagram for operation of the latching circuit of FIG. 15. The example timing diagram of FIG. 16 shows the time variation of the scanning voltage (ϕG), the first driver clock voltage (ϕAC11), third driver clock voltage (ϕAC13), and the voltages at nodes (N11 and N13).

In this timing scheme, the latching control line (LAC1) supplies a voltage that is maintained at an the intermediate level VH10, except during the interval of time between time t14 and time t18 and the interval of time between time t34 and time t38. During these time intervals, the voltage of the latching control line (LAC1) is varied between an H level voltage VH2 and an L level voltage VL.

That is, as shown in FIG. 16, the first driver clock voltage (ϕAC11) changes from an intermediate level voltage VH10 to the H level voltage VH2, from the H level voltage VH2 to the L level voltage VL, and from the L level voltage VL to the intermediate level voltage VH10.

In this example, the voltage at node (N13) changes from the H level voltage VDH (the data voltage) to H level voltage VDH2 (which is higher in magnitude than VDH−Vth).

As a result, the latching conditions do not change when a data voltage is applied on the data line (LD), since transistor (NMTI2) is switched OFF even when the voltage of node (N11) is the H level voltage VDH.

Operation of the latching circuit shown in FIG. 15 is described below based on FIG. 16.

First, a data voltage at an L level voltage VL is applied on the data line (LD).

At time t1, the scanning voltage (ϕG) on the scanning line (LG) is changed from the L level voltage VL to the H level voltage VH1. The input transistor (NMT11) is switched ON and the voltage of node (N11) acquires the data voltage VL.

At time t2, the first driver clock voltage (ϕAC11) is changed from intermediate level voltage VH10 to the H level voltage VH2. Thus, the voltage of node (N11) also increases, based on the retention capacitor (CD), and is set to the H level voltage VDH2. Voltage VDH2 is computed as previously described.

Node (N13) acquires the H level voltage VH3, which is the H level voltage VH2 of the first driver clock voltage (ϕAC11) reduced by the threshold voltage of transistor (NMTI4).

At time t3, the first driver clock voltage (ϕAC11) is changed from the H level voltage VH2 to the L level voltage VL. The voltage of node (NH11) also acquires the L level voltage VL and transistor (NMT12) is switched OFF. Consequently, node (N13) maintains the H level voltage VH3.

At time t4, the first driver clock voltage (ϕAC11) is changed from the L level voltage VL to the intermediate level voltage VH10.

Similar to the examples of FIGS. 11 to 14, the output at the first output terminal (OUT1) is an H level voltage VH3 for a data voltage at the L level voltage VL supplied on the data line (LD).

The operation of the example latching circuit of FIG. 15 when a data voltage at a H level voltage VDH is applied on the data line (LD) is as follows.

At time t21, scanning voltage (ϕG) on the scanning line (LG) is changed from the L level voltage VL to the H level voltage VH1. Input transistor (NMT11) is switched ON and the voltage of node (N11) is set to H level data voltage VDH.

Intermediate level voltage VH10 is higher than (VDH−Vth), therefore transistor (NMT12) remains switched OFF.

At time t22, the first driver clock voltage (ϕAC11) changes from the intermediate level voltage VH10 to the H level voltage VH2. The voltage of node (N11) increases based on the retention capacitor (CD) and is set to the H level voltage VDH3. Accordingly, transistor (NMT12) is switched ON. H level voltage VDH3 is computed as previously described.

Node (N13) acquires H level voltage VH3, which can be computed as the H level voltage VH2 of the first driver clock voltage (ϕAC11) reduced by the threshold voltage of transistor (NMT14).

At time t23, the first driver clock voltage (ϕAC11) changes from the H level voltage VH2 to the L level voltage VL. The voltage of node (N11) is decreased from voltage H level voltage VH3 to H level voltage VDH. Since the first driver clock voltage (ϕAC11) has the L level voltage VL, transistor (NMT12) remains ON. Consequently, node (N13) is set to the L level voltage VL.

At time t24, the first driver clock voltage (ϕAC11) on the first latching control line (LAC11) changes from the L level voltage VL to intermediate level voltage VH10, and transistor (NMT12) is switched ON.

Intermediate level voltage VH10 is greater than (VL+Vth). Consequently, at time t24, the voltage of node (N13) increases through transistor (NMT14) and reaches (VH10−Vth). If voltage VH4 of the second output terminal (OUT2) at that time is changed to an H level voltage, the voltage can be set in such a way that voltage (VH10−Vth) of the first output terminal (OUT1) is an L level voltage. For example, if the latching circuit of this example is used in a display to actuate a movable shutter, the intermediate level voltage VH10 can be set so that the threshold voltage for actuation of the movable shutter (S) is higher than (VH10−Vth).

From time t24 onwards, the first output terminal (OUT1) has voltage level (VH10−Vth).

Figure 17:
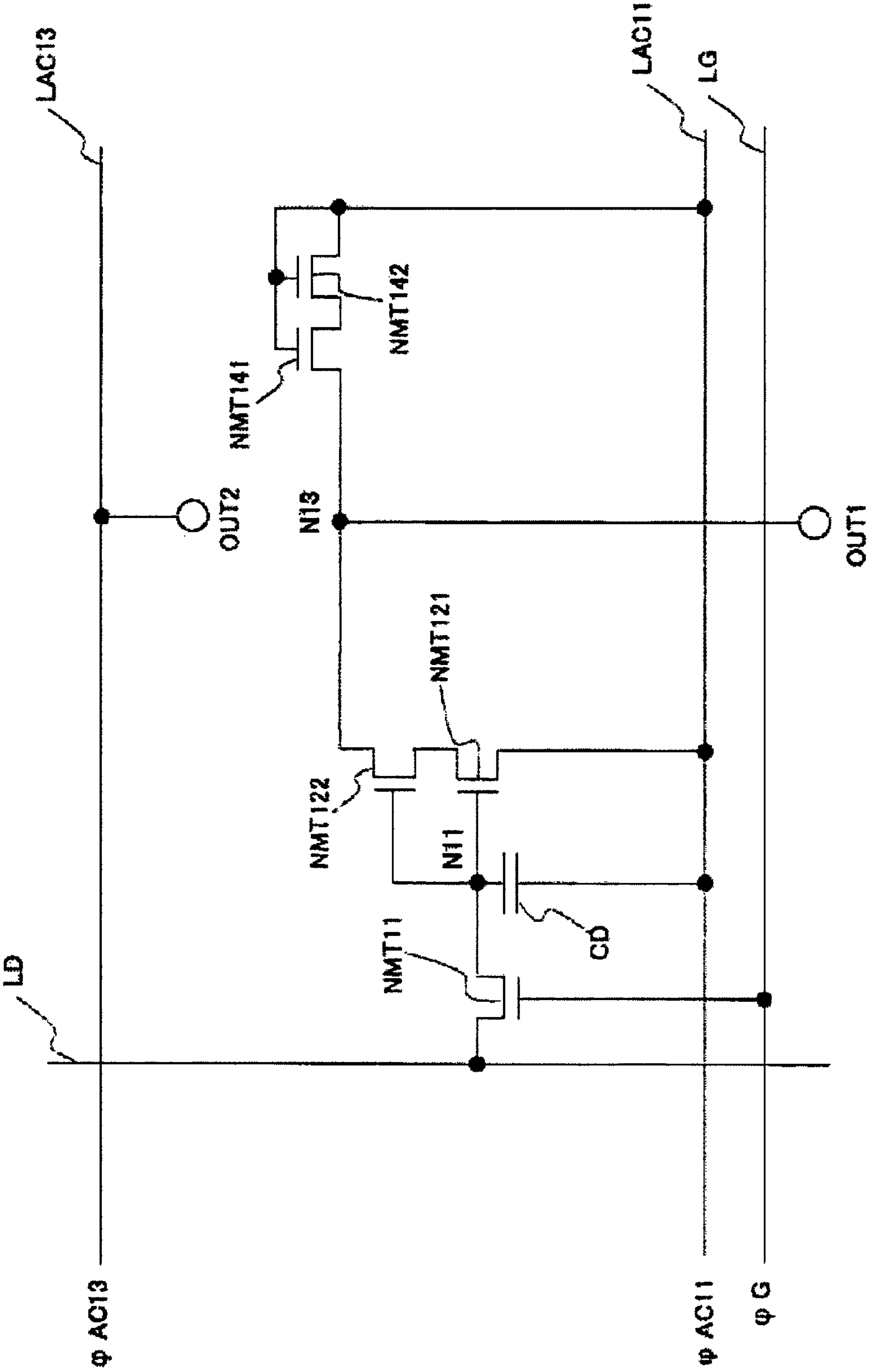
FIG. 17 shows another example latching circuit.

FIG. 17 shows another example latching circuit.

The latching circuit of FIG. 17 is formed from substituting each of the two (2) n-type MOS transistors of FIG. 15, namely NMT12 and NMT14, with two (2) transistors that are coupled using a common gate connection. For example, transistor (NMT12) of FIG. 15 is substituted with transistor (NMT121) and transistor (NMT122), which are connected with a common gate (and therefore receive the same gate voltage). Transistor NMT14 of FIG. 15 can be similarly substituted with double transistors connected with a common gate, as shown in FIG. 17.

With the double-gate transistor structure, the latching circuit of FIG. 17 can handle higher voltages and has a higher effective resistance to source-to-drain leakage.

Although a single input transistor (NMT11) is shown in FIG. 17, it can be substituted with a double gate transistor structure.

While the example latching circuits of FIGS. 5 through 17 are shown based on use of n-type MOS transistors, solely p-type MOS transistors also can be used to form a latching circuit.

Figure 18:
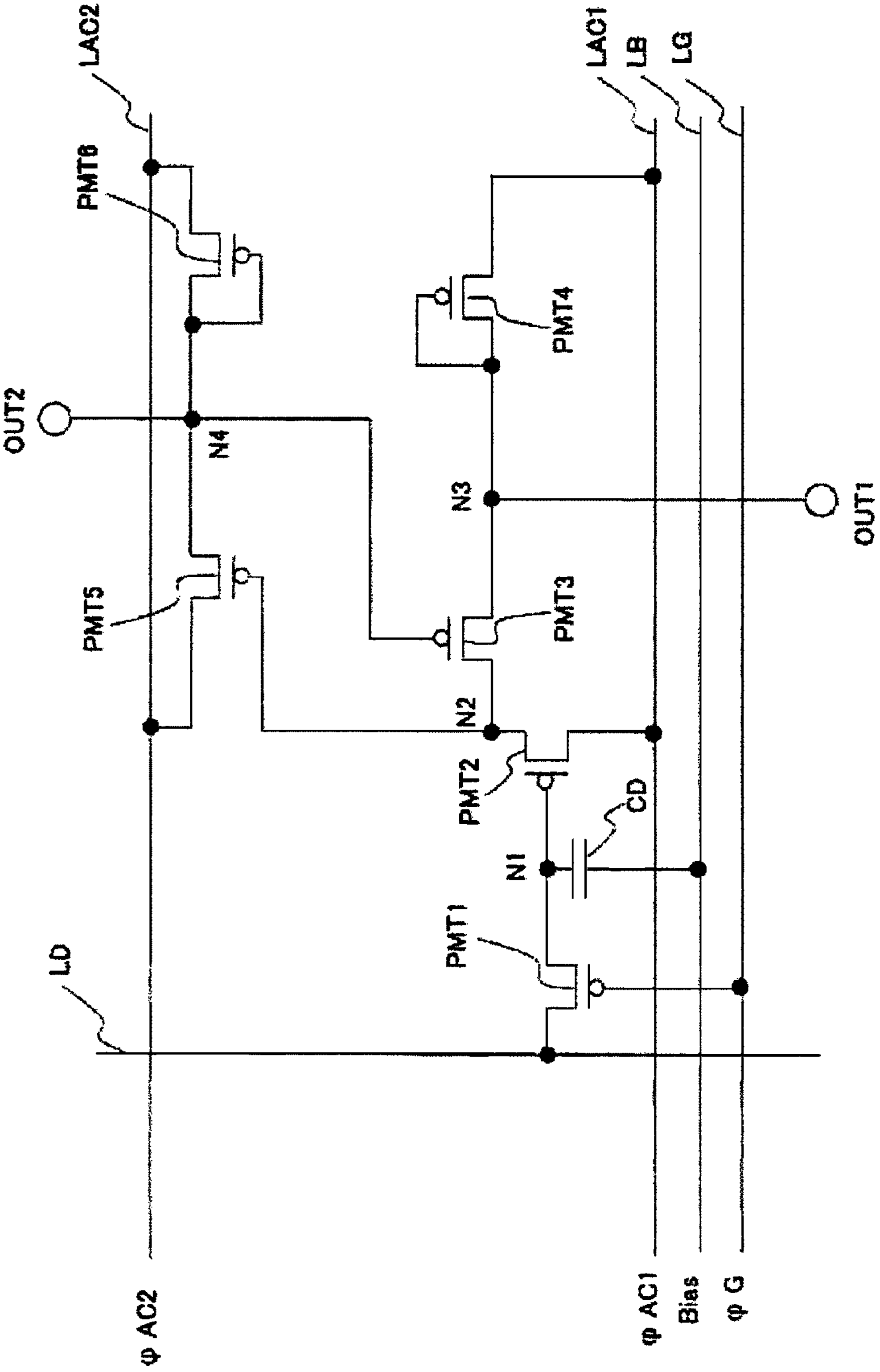
FIG. 18 shows another example latching circuit structure formed with p-type MOS transistors.
Figure 19:
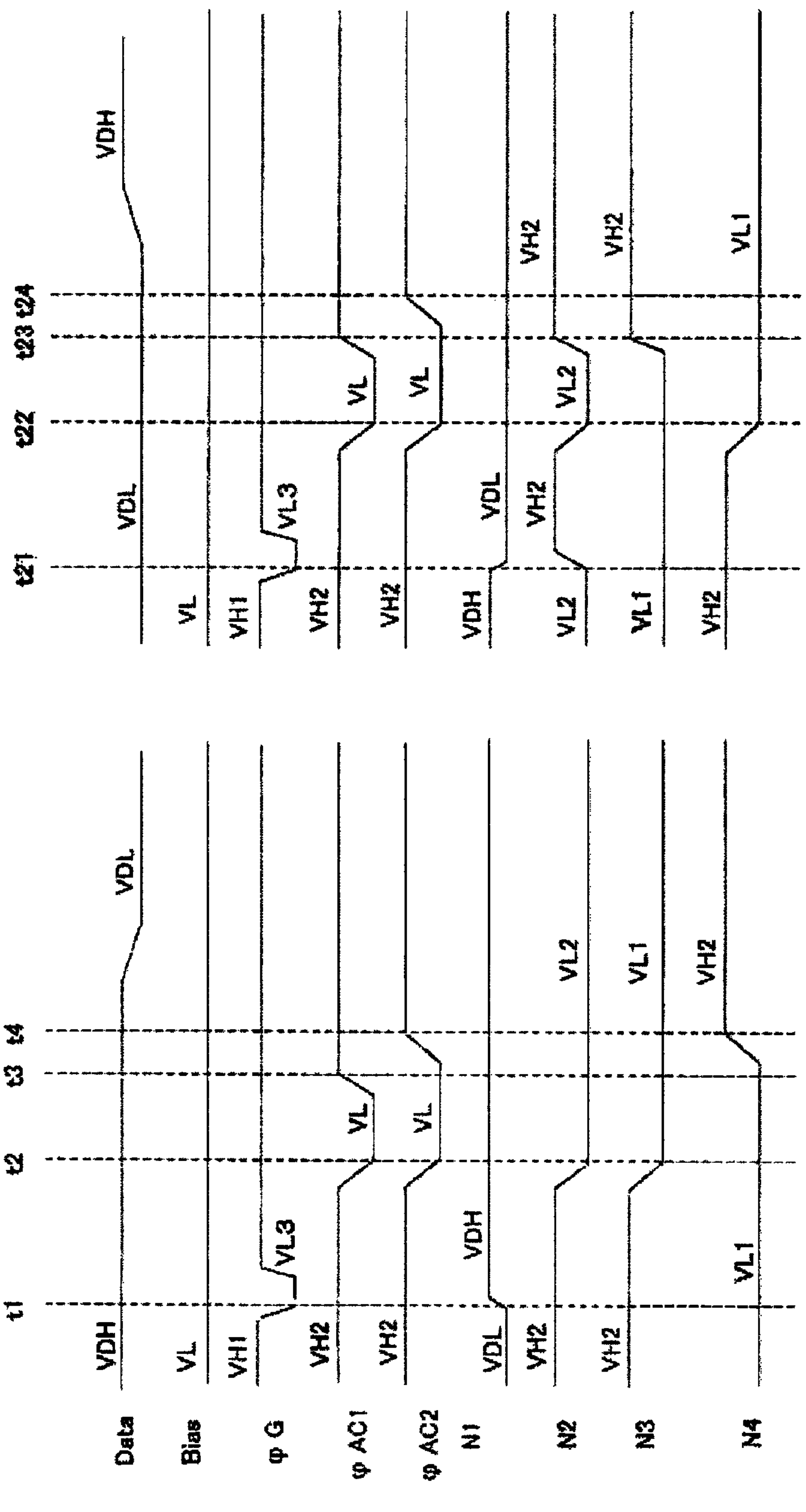
FIG. 19 shows an example timing diagram for operation of the latching circuit of FIG. 18.

FIG. 18 shows an example latching circuit formed with p-type MOS transistors. FIG. 19 shows an example timing diagram for operation of the latching circuit of FIG. 18. The example timing diagram of FIG. 19 shows the time variation of the scanning voltage (ϕG), each driver clock voltage (ϕAC1 and ϕAC2), and the voltages of each node (N1, N2, N3 and N4) of FIG. 18.

The latching circuit in this implementation is constructed with p-type MOS transistor. Therefore, transistor (PMT2) cannot be switched OFF even if the voltage of node (N1) is lower than an H level voltage from the first driver clock voltage (ϕAC1). Consequently, an H level voltage (VDH) on the data line (LD) should be more than the H level voltage (VH2) of the first driver clock voltage (ϕAC1). For example, VDH can be set equal to VH2.

A L level voltage on the data line (LD) should be lower than the threshold voltage Vth of p-type MOS transistor of this implementation. Accordingly, an L level voltage on the data line (LD), the Bias voltage shown in FIG. 19, and VL (i.e., the L level voltage of the first driver clock voltage (ϕAC1)) may not necessarily be equal. In connection with the examples of FIGS. 18 and 19, an L level voltage on the data line (LD) is represented by notation VDL. The H level voltage (VH1) of scanning voltage (ϕG) on the scanning line (LG) should be higher than the H level voltage (VH2) of the first driver clock voltage (ϕAC1). For example, VH1 can be equal to VH2.

In this example implementation, the L level Voltage VL3 of scanning voltage (ϕG) on the scanning line (LG) can be set to less that the L level voltage VDL on data line (LD) reduced by the threshold voltage Vth. Accordingly, the L level on the data line (LD), the bias voltage shown in FIG. 19, and VL (the L level voltage of the first driver clock voltage (ϕAC1) need not be equal. The L level voltage on the data line (LD) can be greater than VL. In this example implementation, the voltages can have the following relationship: VL≤VL3≤VDL−Vth.

The operation of the example latching circuit of FIG. 18 when a data voltage at a H level voltage VDH is applied on the data line (LD) is as follows.

At time t1, scanning voltage (ϕG) on the scanning line (LG) is changed from the H level voltage VH1 to the L level voltage VL3. Input transistor (PMT1) is switched ON and node (N1) is set to the data voltage VDH.

At time t2, the first driver clock voltage (ϕAC1) on the first latching control line (LAC1) and the second driver clock voltage (ϕAC2) on the second latching control line (LAC2) are set to the L level voltage VL. Nodes (N3 and N4) acquire the L level voltage VL1 through transistors (PMT4 and PMT6), respectively. Each of transistors (PMT4 and PMT6) serves as a pre-charge transistor for the corresponding output terminal. Also, each of transistors (PMT4 and PMT6) can be a diode-connected transistor. Here, VL1=VL+Vth.

At this time, transistor (PMT2) is switched OFF. Transistor (PMT3) is switched ON since node (N4) acquires the L level voltage VL1. Accordingly, node (N2) acquires the L level voltage VL2. Here, VL2=VL1+Vth.

At time t3, the first driver clock voltage (ϕAC1) is set to the H level voltage VH2. Transistor (PMT3) remains switched ON and transistor (PMT2) remains switched OFF. Since transistor (PMT4) is a diode-connected transistor, current does not flow from the first latching control line (LAC1) to node (N3). Accordingly, the L level voltage VL1 is maintained on node (N3).

At time t4, the second driver clock voltage (ϕAC2) is set to the H level voltage VH2. As the voltage of node (N2) is the L level VL2, transistor (PMT5) is switched ON. As transistor (PMT6) is a diode-connected transistor, current does not flow from the second latching control line (LAC2) to node (N4). Accordingly, the H level voltage VH2 is maintained on node (N4). Therefore, transistor (PMT3) is switched OFF. Consequently, node (N3) is set at the L level voltage VL1 (the first output terminal (OUT1)) and node (N4) is set at the H level voltage VH2 (the second output terminal (OUT2)).

The operation of the example latching circuit of FIG. 18 when a data voltage at a L level voltage VDL is applied on the data line (LD) is as follows.

At time t21, scanning voltage (ϕG) on the scanning line (LG) is changed to the L level voltage VL3. Input transistor (PMT1) is switched ON and node (N1) is set to voltage VDL.

Here, VDL<Vth, transistor (PMT2) is switched ON and voltage of node (N2) is changed to the H level voltage VH2.

As a result, transistor (PMT5) is switched OFF. The voltage of node (N4) remains H level voltage VH2, or becomes VH2+ΔV3. Voltage ΔV3 is the voltage variance that is imported to node (N4) from the coupling capacitance of transistor (PMT5) at the time it changes to the H level voltage VH2 from the L level voltage VL2.

Since node (N4) is at the H level voltage VH2 (or VH2+ΔV3), the transistor (PMT3) is switched OFF and node (N3) is maintained at the L level voltage VL1.

At time t22, the first driver clock voltage (ϕAC1) and the second driver clock voltage (ϕAC2) are set to the L level voltage VL at substantially the same time. Similarly as at time t2, the voltage of nodes (N3 and N4) are set to the L level voltage VL1; the voltage of node (N2) is set to the L level voltage VL2.

At time t23, the first driver clock voltage (ϕAC1) is set to the H level voltage VH2. At that time, since the voltage of node (N1) is not changed to the L level voltage VDL, transistor (PMT2) remains switched ON. Also, since the voltage of node (N4) is not changed to the L level voltage VL1, transistor (PMT3) also remains switched ON. Accordingly, nodes (N2 and N3) are set to the H level voltage VH2.

At time t24, the second driver clock voltage (ϕAC2) is set to the H level voltage VH2. At that time, the voltage of node (N2) remains at the H level voltage VH2. Therefore, transistor (PMT5) remains switched OFF. Since transistor (PMT6) is s diode-connected transistor, current does not flow from the second latching control line (LAC2) to node (N4). Accordingly, node (N4) remains at the L level voltage VL1.

Consequently, the first output terminal (OUT1) is set at the H level voltage VH2 (of node (N3)) and the second output terminal (OUT2) is set at the L level voltage VL1 (of node (N4)).

In an example, a pixel circuit can be formed based on the latching circuit of FIG. 18 and a movable shutter control line (LSS) configured to connect to a shutter (S). Such a pixel circuit can be used to actuate a movable shutter (S). An arrangement (e.g., two-dimensional array) of these pixel circuits can be used to form a display. The display can display images by electrically actuating the movable shutters (S) associated with each pixel, using the voltage difference between the outputs of the latching circuit of FIG. 18.

Definition of Terms

NMT* n type MOS transistor
PMT* p type MOS transistor
CD retention capacitor
LD the data line
LG the scanning line
LB the bias line
LAC* the latching control lines
LDVV, LGND power lines
LSS the movable shutter control line
S the movable shutter
N* Node
XDR Vertical drive circuit
YDR Horizontal drive circuit The disclosure described latching circuits of various pixel circuits for actuating a movable shutter of a display. However, the latching circuits described herein are applicable to any similar operation that can be applied in displays other than a pixel circuit for actuating a movable shutter. In addition, various changes can be made to the systems, apparatus and methods described herein without departing from the scope of this disclosure.

What is claimed is:

1. An apparatus, comprising:

a plurality of MEMS devices arranged in an array; and a control matrix comprising only n-type or only p-type transistors coupled to the plurality of MEMS devices to communicate data and drive voltages to the MEMS devices, wherein the control matrix, for each MEMS device, comprises:

a latch configured to maintain a difference in voltage levels on a first output terminal and a second output terminal, the latch comprising:

a first pre-charge transistor and a first output terminal discharge transistor coupled to the first output terminal;

a second pre-charge transistor and a second output terminal discharge transistor coupled to the second output terminal; and a pixel discharge transistor coupled to the first output terminal discharge transistor and the second output terminal discharge transistor;

wherein the latch is configured such that a state of the first output terminal discharge transistor is controlled based on a voltage level of the second output terminal applied to a gate of the first output terminal discharge transistor.

2. The apparatus of claim 1, wherein the first pre-charge transistor comprises a diode-connected transistor.

3. The apparatus of claim 1, wherein the apparatus is a display apparatus and the MEMS device comprises a shutter, and wherein the shutter is actuated based on the voltage levels on the first output terminal and the second output terminal.

4. The apparatus of claim 1, further comprising a first latching control line coupled to the first output terminal by the first pre-charge transistor and configured to apply a first driver voltage;

wherein the first pre-charge transistor is configured to pre-charge the first output terminal from a first voltage level to a second voltage level, different from the first voltage level, based on application of the first driver voltage; and wherein the apparatus is configured to discontinue the first driver voltage such that the first output terminal returns to the first voltage level, or maintains the first output terminal at the second voltage level, based on a voltage retained in a retention capacitor.

5. The apparatus of claim 4, wherein an end of the retention capacitor is connected to the first latching control line, and wherein the first driver voltage acts as a bias voltage of the retention capacitor.

6. The apparatus of claim 4, further comprising a second latching control line coupled to the second output terminal by the second pre-charge transistor and configured to apply a second driver voltage;

wherein the second pre-charge transistor is configured to pre-charge the second output terminal from the first voltage level to the second voltage level based on application of the second driver voltage; and;

wherein the apparatus is configured to discontinue the second driver voltage at a later time than the first driver voltage is discontinued such that the voltage is retained in the retention capacitor.

7. The apparatus of claim 6, wherein the apparatus is configured to initiate the first driver voltage and the second driver voltage at a same time.

8. The apparatus of claim 1, wherein the pixel discharge transistor controls a discharge of the first output terminal and the second output terminal through the first output terminal discharge transistor and the second output terminal discharge transistor.

9. The apparatus of claim 1, wherein each of the first pre-charge transistor, the first output terminal discharge transistor, the second pre-charge transistor, and the second output terminal discharge transistor is configured as two transistors coupled with a common gate.

10. An apparatus, comprising:

a plurality of MEMS devices arranged in an array; and a control matrix comprising only n-type or only p-type transistors coupled to the plurality of MEMS devices to communicate data and drive voltages to the MEMS devices, wherein the control matrix, for each MEMS device, comprises:

a latch configured to maintain a difference in voltage levels on a first output terminal and a second output terminal, the latch comprising:

a first pre-charge transistor and a first output terminal discharge transistor coupled to the first output terminal; and a second output terminal discharge transistor coupled to the first output terminal discharge transistor;

wherein the latch is configured such that the output of the second output terminal discharge transistor selectively controls the first output terminal discharge transistor to selectively discharge voltage stored on the first output terminal, thereby controlling a voltage level of the first output terminal.

11. The apparatus of claim 10, wherein the first pre-charge transistor comprises a diode-connected transistor.

12. The apparatus of claim 10, wherein the apparatus is a display apparatus and the MEMS device comprises a shutter, and wherein the shutter is actuated based on the voltage levels on the first output terminal and the second output terminal.

13. The apparatus of claim 10, further comprising:

a first latching control line coupled to the first output terminal by the first pre-charge transistor and configured to apply a first driver voltage; and a second latching control line coupled to the second output terminal discharge transistor and configured to apply a second driver voltage to switch the second output terminal discharge transistor;

wherein the apparatus is configured to discontinue the second driver voltage at a later time than the first driver voltage is discontinued such that the second output terminal discharge transistor controls the discharge of the first output terminal discharge transistor, thereby controlling a voltage level of the first output terminal.

14. The apparatus of claim 13, wherein the apparatus is configured to maintain the voltage level of the first output terminal until a subsequent the first driver voltage is applied.

15. The apparatus of claim 13, wherein the apparatus is configured to initiate the first driver voltage and the second driver voltage at a same time.

16. The apparatus of claim 13, wherein each of the first pre-charge transistor, the first output terminal discharge transistor, and the second output terminal discharge transistor is configured as two transistors coupled with a common gate.

17. An apparatus, comprising:

a plurality of MEMS devices arranged in an array; and a control matrix comprising only n-type or only p-type transistors coupled to the plurality of MEMS devices to communicate data and drive voltages to the MEMS devices, wherein the control matrix, for each MEMS device, comprises:

a latch configured to maintain a difference in voltage levels on a first output terminal and a second output terminal, the latch comprising:

a first pre-charge transistor and a first output terminal discharge transistor coupled to the first output terminal; and a first latching control line coupled to the first output terminal by the first pre-charge transistor;

wherein the first output terminal discharge transistor is coupled to an electrode of the first latching control line; and wherein the apparatus is configured to apply to the first latching control line a first driver voltage that changes from an intermediate voltage level that has a magnitude intermediate between a first voltage level and a second voltage level, to the second level voltage, from the second voltage level to the first voltage level, and from the first voltage level to the intermediate voltage level at a time that a voltage on the first output terminal changes from the first voltage level to the second voltage level.

18. The apparatus of claim 17, wherein the latch is configured such that applying the first driver voltage changes a voltage level of the first output terminal from the first voltage level to the second voltage level.

19. The apparatus of claim 17, wherein the first pre-charge transistor comprises a diode-connected transistor.

20. The apparatus of claim 17, wherein the apparatus is a display apparatus and the MEMS device comprises a shutter, and wherein the shutter is actuated based on the voltage levels on the first output terminal and the second output terminal.

* * * * *